US012575210B2

(12) United States Patent (10) Patent No.: US 12,575,210 B2
Lee et al. (45) Date of Patent: Mar. 10, 2026

(54) IMAGE SENSOR

(71) Applicant: Samsung Electronics Co., Ltd.,
Suwon-si (KR)

(72) Inventors: Wook Lee, Suwon-si (KR); **Seonghoon
Ko, Suwon-si (KR); Jaeho Kim,**
Suwon-si (KR)

(73) Assignee: Samsung Electronics Co., Ltd.,
Gyeonggi-do (KR)

( * ) Notice: Subject to any disclaimer, the term of this
patent is extended or adjusted under 35
U.S.C. 154(b) by 372 days.

(21) Appl. No.: 18/331,343

(22) Filed: Jun. 8, 2023

(65) Prior Publication Data

US 2024/0014241 A1     Jan. 11, 2024

(30) Foreign Application Priority Data

Jul. 8, 2022     (KR) ........................ 10-2022-0084620

(51) Int. Cl.
*H10F 39/00*     (2025.01)
(52) U.S. Cl.
CPC ......... *H10F 39/807* (2025.01); *H10F 39/802*
(2025.01); *H10F 39/80373* (2025.01); *H10F*
*39/811* (2025.01)
(58) Field of Classification Search
CPC ................. H10F 39/807; H10F 39/802; H10F
39/80373; H10F 39/811; H10F 39/014;
H10F 39/151
See application file for complete search history.

(56) References Cited

U.S. PATENT DOCUMENTS 7,364,960 B2 * 4/2008 Lyu ....................... H10F 39/802
257/E21.189
8,531,567 B2 9/2013 Roy et al.
8,575,035 B2 11/2013 Chen et al.
9,647,016 B2 5/2017 Oh et al.
(Continued)

FOREIGN PATENT DOCUMENTS

KR 10-2006-0026262 A 3/2006
KR 10-2006-0034926 A 4/2006
(Continued)

OTHER PUBLICATIONS

Office Action issued Oct. 13, 2025 Taiwaniese Application No.
112124970.

*Primary Examiner* — S M Sohel Imtiaz
(74) *Attorney, Agent, or Firm* — Harness, Dickey &
Pierce, P.L.C.

(57) ABSTRACT
An image sensor includes a dual vertical gate including two
vertical portions apart from each other by an isolation area
in a first direction and vertically extending into a substrate,
a connection portion configured to connect the two vertical
portions to each other on the two vertical portions, and a
device isolation layer on side surfaces of the vertical por-
tions in the first direction, wherein each of the two vertical
portions includes an upper vertical portion and a lower
vertical portion, a sidewall of the upper vertical portion
forms a first inclination angle with a line extending in the
first direction, a sidewall of the lower vertical portion forms
a second inclination angle with the line extending in the first
direction, and the first inclination angle is different from the
second inclination angle.

19 Claims, 21 Drawing Sheets

(56) References Cited

U.S. PATENT DOCUMENTS

| | | | |
|---|---|---|---|
| 2015/0115337 A1* | 4/2015 | Yang ........................ | H10F 39/18 |
| | | | 257/292 |
| 2018/0151618 A1 | 5/2018 | Tsai | |
| 2019/0172857 A1 | 6/2019 | Lin et al. | |
| 2021/0210534 A1* | 7/2021 | Chen .................... | H10D 64/513 |
| 2021/0305298 A1* | 9/2021 | Hu ........................ | H10F 39/014 |
| 2022/0367545 A1* | 11/2022 | Kimizuka .............. | H10D 30/60 |
| 2022/0375977 A1* | 11/2022 | Zang ................ | H10F 39/80373 |
| 2023/0223413 A1* | 7/2023 | Zang ................ | H10F 39/80377 |
| | | | 257/292 |

FOREIGN PATENT DOCUMENTS

| | | |
|---|---|---|
| TW | 1748481 B | 12/2021 |
| TW | 202203445 A | 1/2022 |
| WO | 2021-010024 A1 | 1/2021 |

* cited by examiner

IMAGE SENSOR

CROSS-REFERENCE TO RELATED APPLICATION

This application is based on and claims priority under 35 U.S.C. § 119 to Korean Patent Application No. 10-2022-0084620, filed on Jul. 8, 2022, in the Korean Intellectual Property Office, the disclosure of which is incorporated by reference herein in its entirety.

BACKGROUND

The inventive concepts relate to an image sensor. Specifically, the inventive concepts relate to an image sensor including a dual vertical gate.

The image sensor may convert an optical image into an electrical signal. Commonly used image sensors may include charge-coupled device (CCD)-type image sensors and complementary-metal-oxide-semiconductor (CMOS) image sensors (CISs). An image sensor may include a plurality of pixels arranged in a two-dimensional (2D) matrix form, and each of the pixels may output an image signal from light energy. Each of the pixels may accumulate photocharges corresponding to the quantity of light incident through a photoelectric conversion element and output a pixel signal based on the accumulated photocharges. In recent years, as the integration density of image sensors greatly increases, the size of pixels and the sizes of components of a pixel circuit are showing a tendency to decrease.

SUMMARY

The inventive concepts provide an image sensor including a dual vertical gate, which may be formed even in a fine pixel area, have improved interfacial characteristics and noise characteristics, and prevent or hinder the occurrence of a misalignment.

According to an example embodiment of the inventive concepts, there is provided an image sensor including a dual vertical gate including two vertical portions and a connection portion, the two vertical portions being spaced apart from each other in a first direction by an isolation area, the two vertical portions extending into a substrate in a second direction, the connection portion being on the two vertical portions and connecting the two vertical portions to each other, wherein the second direction is perpendicular to the first direction, and a device isolation layer on side surfaces of the vertical portions, the side surfaces extending in the first direction, wherein each of the two vertical portions includes an upper vertical portion and a lower vertical portion, a sidewall of the upper vertical portion forms a first inclination angle with a line extending in the first direction, a sidewall of the lower vertical portion forms a second inclination angle with the line extending in the first direction, and the first inclination angle is different from the second inclination angle.

According to another example embodiment of the inventive concepts, there is provided an image sensor including a substrate, a dual vertical gate in an upper portion of the substrate, a photoelectric conversion element under the dual vertical gate in the substrate, a device isolation layer adjacent to the dual vertical gate in a first direction, the first direction being parallel to a top surface of the substrate, and a floating diffusion region adjacent to the dual vertical gate in the upper portion of the substrate, wherein the dual vertical gate includes two vertical portions apart from each other by an isolation area in the first direction, the two vertical portions extending into the substrate in a second direction, wherein the second direction is perpendicular to the first direction, and a connection portion connecting the two vertical portions to each other on the two vertical portions, wherein each of the two vertical portions includes an upper vertical portion and a lower vertical portion, a sidewall of the upper vertical portion forms a first inclination angle with a line extending in the first direction, a sidewall of the lower vertical portion forms a second inclination angle with the line extending in the first direction, and the first inclination angle is different from the second inclination angle.

According to another example embodiment of the inventive concepts, there is provided an image sensor including a substrate, a dual vertical gate in an upper portion of the substrate, a gate dielectric layer surrounding at least a portion of the dual vertical gate, a photoelectric conversion element under the gate vertical gate in the substrate, a device isolation layer adjacent to the dual vertical gate in a first direction in the upper portion of the substrate, the first direction being parallel to a top surface of the substrate, and a floating diffusion region adjacent to the dual vertical gate in an upper portion of the substrate, wherein the dual vertical gate includes two vertical portions apart from each other by an isolation area in the first direction, the two vertical portions vertically extending into the substrate in a second direction, wherein the second direction is perpendicular to the first direction, and a connection portion connecting the two vertical portions to each other on the two vertical portions, wherein each of the two vertical portions includes an upper vertical portion and a lower vertical portion, a sidewall of the upper vertical portion forms a first inclination angle with a line extending in the first direction, a sidewall of the lower vertical portion forms a second inclination angle with the line extending in the first direction, wherein the second inclination angle is different from the first inclination angle, and wherein a top surface of the upper vertical portion is at a same vertical level as a top surface of the device isolation layer, a bottom surface of the upper vertical portion is at a same vertical level as a bottom surface of the device isolation layer, and the upper vertical portion is in contact with the device isolation layer.

BRIEF DESCRIPTION OF THE DRAWINGS

Some example embodiments of the inventive concepts will be more clearly understood from the following detailed description taken in conjunction with the accompanying drawings in which.

DETAILED DESCRIPTION OF THE EMBODIMENTS

Figure 1:
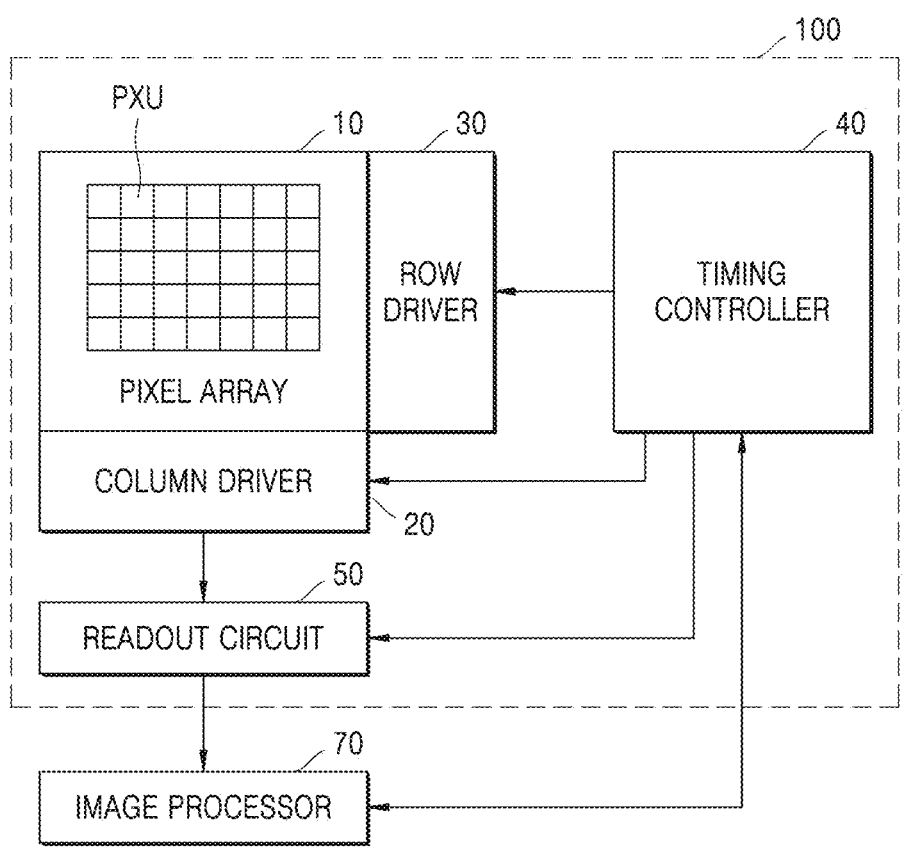
FIG. 1 is a block diagram of an image sensor according to some example embodiments.

Hereinafter, some example embodiments of the inventive concepts will be described in detail with reference to the accompanying drawings. Like reference numerals in the accompanying drawings refer to like elements throughout, and duplicate descriptions thereof are omitted.

FIG. 1 is a block diagram of an image sensor 100 according to some example embodiments.

Referring to FIG. 1, the image sensor 100 according to some example embodiments may include a pixel array 10 and circuits configured to control the pixel array 10. In some example embodiments, the circuits configured to control the pixel array 10 may include a column driver 20, a row driver 30, a timing controller 40, and a readout circuit 50.

The image sensor 100 may operate according to a control command received from an image processor 70, and may convert light transmitted from an external object into an electrical signal and output the electrical signal to the image processor 70. The image sensor 100 may be a complementary metal-oxide semiconductor (CMOS) image sensor.

The pixel array 10 may include a plurality of unit pixels PXU having a two-dimensional array structure arranged in a matrix form along a plurality of row lines and a plurality of column lines.

Each of (or alternatively, at least one of) the plurality of unit pixels PXU may have a photoelectric conversion element. The photoelectric conversion element may generate electric charges by receiving light transmitted from the object. The image sensor 100 may perform an autofocus function by using a phase difference between pixel signals generated from a plurality of photoelectric conversion elements included in the plurality of unit pixels PXU. Each of (or alternatively, at least one of) the plurality of unit pixels PXU may include a pixel circuit for generating a pixel signal from electric charges generated by the photoelectric conversion element.

The column driver 20 may include a correlated double sampler (CDS), an analog-to-digital converter (ADC), and the like. The CDS may be connected, through column lines, to a unit pixel PXU included in a row selected by a row selection signal supplied by the row driver 30 and perform correlated double sampling to detect a reset voltage and a pixel voltage. The ADC may convert the reset voltage and the pixel voltage each detected by the CDS into digital signals and transmit the digital signals to the readout circuit 50.

The readout circuit 50 may include a latch or buffer circuit, which is capable of temporarily storing digital signals, an amplifying circuit, and the like, and may temporarily store or amplify digital signals received from the column driver 20 to generate image data. The operation timing of the column driver 20, the row driver 30, and the readout circuit 50 may be determined by the timing controller 40, and the timing controller 40 may operate based on a control command transmitted from the image processor 70.

The image processor 70 may signal-process image data output from the readout circuit 50 and output the signal-processed image data to a display device or store the signal-processed image data in a storage device, such as a memory. When the image sensor 100 is mounted on an autonomous vehicle, the image processor 70 may signal-process image data and transmit the signal-processed image data to a main controller that controls the autonomous vehicle.

Figure 2:
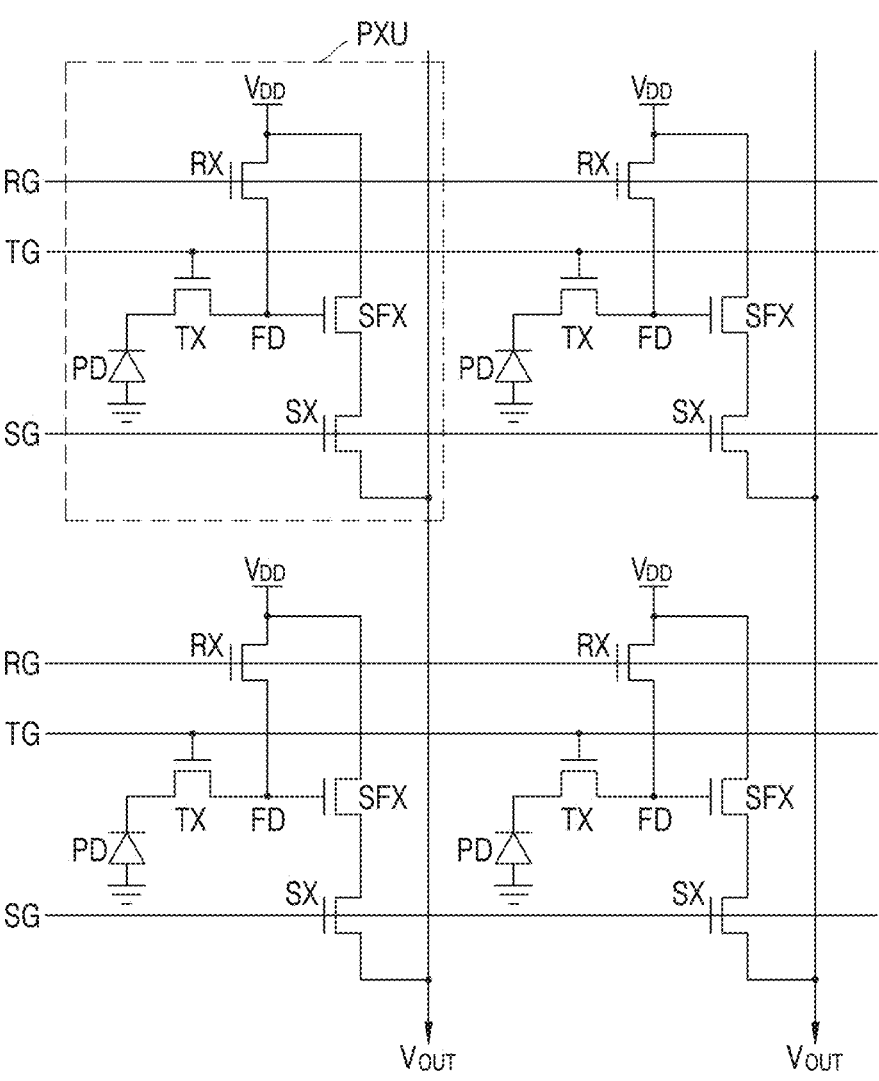
FIG. 2 is a circuit diagram of a pixel array of an image sensor according to some example embodiments.

FIG. 2 is a circuit diagram of a pixel array of an image sensor according to some example embodiments.

Referring to FIG. 2, unit pixels PXU, each of (or alternatively, at least one of) which includes a transfer transistor TX and logic transistors (e.g., RX, SX, and SFX), may be arranged in an array form.

A plurality of unit pixels PXU may be provided. In some example embodiments, a plurality of unit pixels PXU may be arranged in a matrix form. Here, the logic transistors may include a reset transistor RX, a selection transistor SX, and a source follower transistor SFX. The reset transistor RX may include a reset gate RG, and the selection transistor SX may include a selection gate SG. In some example embodiments, the transfer transistor TX may include a dual vertical gate (see 110 in FIG. 3). The transfer transistor TX and the dual vertical gate 110 will be described in further detail below with reference to FIGS. 3 and 4.

The unit pixel PX may further include a photoelectric conversion element PD and a floating diffusion region FD. The photoelectric conversion element PD may generate and accumulate charges in proportion to the quantity of light incident from the outside and include a photodiode, a phototransistor, a photogate, a pinned photodiode (PPD), or a combination thereof.

The transfer transistor TX may transmit the photocharges generated in the photoelectric conversion element PD to the floating diffusion region FD. The floating diffusion region FD may receive the photocharges generated in the photoelectric conversion element PD and cumulatively store the photocharges. The source follower transistor SFX may be controlled according to the quantity of photocharges accumulated in the floating diffusion region FD.

The reset transistor RX may periodically reset the photocharges accumulated in the floating diffusion region FD. A drain electrode of the reset transistor RX may be connected to the floating diffusion region FD, and a source electrode of the reset transistor RX may be connected to a power supply voltage VDD.

When the reset transistor RX is turned on, the power supply voltage VDD connected to the source electrode of the reset transistor RX may be transmitted to the floating diffusion region FD. When the reset transistor RX is turned on, photocharges accumulated in the floating diffusion region FD may be emitted, and thus, the floating diffusion region FD may be reset.

The source follower transistor SFX may be connected to a current source (not shown) located outside the unit pixel PXU and function as a source follower buffer amplifier. The source follower transistor SFX may amplify a potential variation of the floating diffusion region PD and output the amplified potential variation to an output line $V_{OUT}$.

The selection transistor SX may select the plurality of unit pixels PXU in units of rows. When the selection transistor SX is turned on, the power supply voltage VDD may be transmitted to a source electrode of the source follower transistor SFX.

Figure 3:
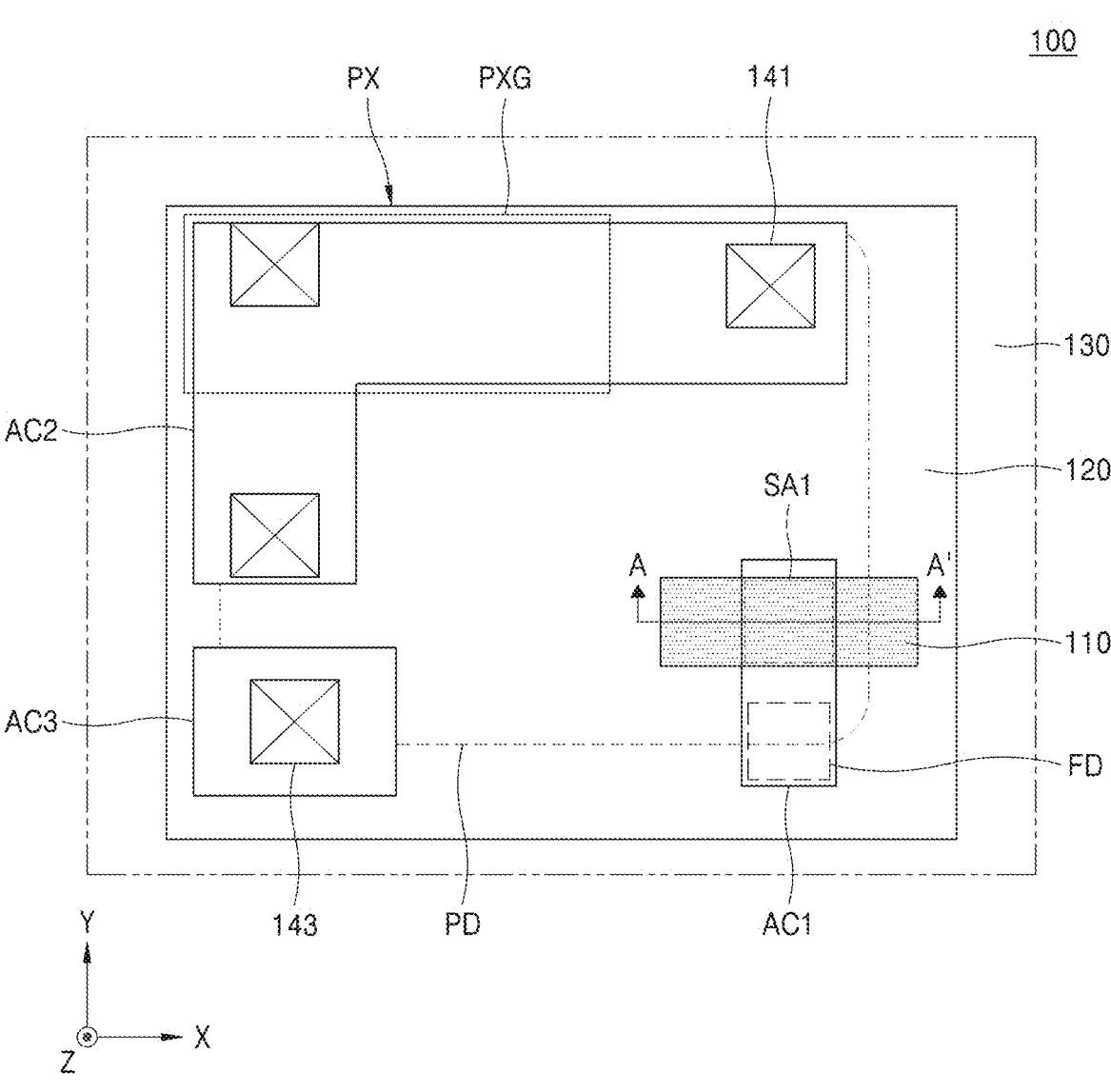
FIG. 3 is a plan view of a pixel of an image sensor, according to some example embodiments.
Figure 4:
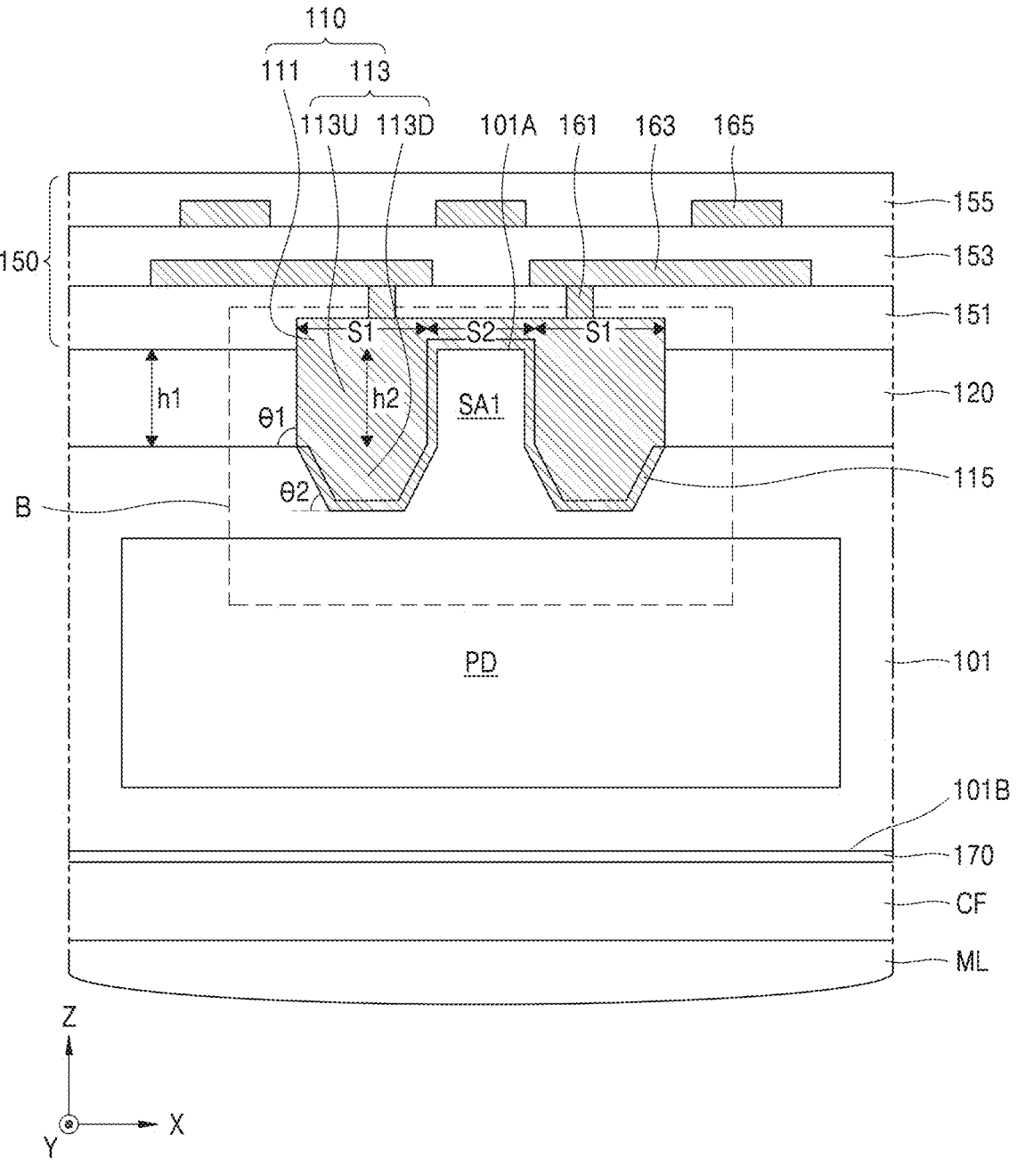
FIG. 4 is a cross-sectional view taken along line A-A' of FIG. 3.

FIG. 3 is a plan view of a pixel of an image sensor 100 according to some example embodiments. FIG. 4 is a cross-sectional view taken along line A-A' of FIG. 3.

Referring to FIGS. 3 and 4, the image sensor 100 may include a substrate 101 having a pixel area PX. Although one pixel area PX is illustrated in FIG. 3, the substrate 101 may include a plurality of pixel areas PX. In the substrate 101, the pixel area PX may be defined by a pixel isolation layer 130. The pixel area PX may include a photoelectric conversion element PD formed in the substrate 101. The pixel area PX may be a region configured to sense light incident from the outside.

The substrate 101 may include a semiconductor layer. In some example embodiments, the substrate 101 may include a semiconductor layer doped with P-type impurities. For example, the substrate 101 may include a semiconductor layer or a silicon on insulator (SOI) substrate. The semiconductor layer may include silicon (Si), germanium (Ge), silicon germanium (SiGe), a Group II-VI compound semiconductor, a Group III-V compound semiconductor, or a combination thereof. In some example embodiments, the substrate 101 may include a P-type epitaxial semiconductor layer, which is epitaxially grown from a P-type bulk silicon substrate. The substrate 101 may include a front surface 101A and a rear surface 101B opposite to the front surface 101A.

The pixel isolation layer 130 may have a planar structure surrounding the photoelectric conversion element PD. The pixel isolation layer 130 may extend long from the front surface 101B to the rear surface 101B of the substrate 101 in a thickness direction of the substrate 101. In some example embodiments, the pixel isolation layer 130 may include silicon oxide, silicon nitride, silicon carbonitride (SiCN), silicon oxynitride (SiON), silicon oxycarbide (SiOC), polysilicon, a metal, a metal nitride, a metal oxide, borosilica glass (BSG), phosphosilica glass (PSG), boro-phosphosilica glass (BPSG), plasma-enhanced tetra ethyl ortho silicate (PE-TEOS), fluoride silicate glass (FSG), carbon doped silicon oxide (CDO), organo silicate glass (OSG), air, or a combination thereof. For example, the metal that may be included in the pixel isolation layer 130 may include tungsten (W), copper (Cu), or a combination thereof. The metal nitride that may be included in the pixel isolation layer 130 may include titanium nitride (TiN), tantalum nitride (TaN), or a combination thereof. The metal oxide that may be included in the pixel isolation layer 130 may include indium tin oxide (ITO), aluminum oxide ($Al_2O_3$), or a combination thereof.

The pixel isolation layer 130 may have one of various shapes. For example, the pixel isolation layer 130 may not entirely pass through the substrate 101. The pixel isolation layer 130 may pass through a device isolation layer 120 or contact a bottom surface of the device isolation layer 120 without passing through the device isolation layer 120.

The device isolation layer 120 defining a plurality of active areas (e.g., AC1, AC2, and AC3) may be on the front surface 101A of the substrate 101. The plurality of active areas (e.g., AC1, AC2, and AC3) may include a first active area AC1, a second active area AC2, and a third active area AC3. The bottom surface of the device isolation layer 120 may be vertically apart from the photoelectric conversion element PD. A depth of the device isolation layer 120 may be less than a depth of the pixel isolation layer 130. In some example embodiments, the device isolation layer 120 may include an insulating layer, which includes a silicon oxide layer, a silicon nitride layer, or a combination thereof.

In a view from above (or on an X-Y plane), the first active area AC1 may have a T shape, the second active area AC2 may have an L shape, and the third active area AC3 may have a rectangular shape. However, the inventive concepts are not limited thereto, the first to third active areas AC1, AC2, and AC3 may have various shapes. For example, the second active area AC2 may have a rectangular shape that extends long in one lateral direction.

A transfer transistor (see TX in FIG. 2) and a floating diffusion region FD may be arranged in the first active area AC1. The transfer transistor TX may include a dual vertical gate 110.

The dual vertical gate 110 may include a connection portion 111 and two vertical portions 113. On the X-Y plane, the dual vertical gate 110 may have a different shape according to a vertical level. Specifically, on the X-Y plane, the dual vertical gate 110 may have one rectangular shape at a higher vertical level than a top surface of an isolation area SA1 and have two rectangular shapes, which are apart from each other in a first direction (X direction), at a lower vertical level than the top surface of the isolation area SA1.

The two vertical portions 113 may each vertically extend into the substrate 101 and be apart from each other by the isolation area SA1 in the first direction (X direction). Here, a vertical direction refers to a second direction (Z direction) that is perpendicular to a top surface of the substrate 101. The isolation area SA1 refers to a portion of the substrate 101 (e.g., a semiconductor substrate), which is covered by the dual vertical gate 110 and between the two vertical portions 113.

In the substrate 101, two trenches 113T may be apart from each other with the isolation area SA1 therebetween, and two vertical portions 113 may be respectively inside the two trenches 113T. The isolation area SA1 of the substrate 101 may be exposed at first sidewalls of the two trenches 113T, which face each other, and the device isolation layer 120 may be exposed at least portions (e.g., upper portions) of second sidewalls of the two trenches 113T, which are opposite to the first sidewalls of the two trenches 113T.

Each of (or alternatively, at least one of) the two vertical portions 113 may include an upper vertical portion 113U and a lower vertical portion 113D. The upper vertical portion 113U may be on the lower vertical portion 113D, and the upper vertical portion 113U and the lower vertical portion 113D may be in contact with each other. That is, a bottom surface of the upper vertical portion 113U may be in contact with a top surface of the lower vertical portion 113D. A length h2 of the upper vertical portion 113U in the second direction may be substantially equal to a length h1 of the device isolation layer 120 in the second direction. That is, the top surface of the upper vertical portion 113U may be at the same vertical level as a top surface of the device isolation layer 120, and the bottom surface of the upper vertical portion 113U may be at the same vertical level as the bottom surface of the device isolation layer 120. In some example embodiments, the top surface of the lower vertical portion 113D may be at the same vertical level as the bottom surface of the device isolation layer 120.

A sidewall of the upper vertical portion 113U may form a first inclination angle θ1 with an imaginary line parallel to a first direction (x direction). A sidewall of the lower vertical portion 113D may form a second inclination angle θ2 with the imaginary line parallel to the first direction (x direction). In this case, the first inclination angle θ1 may be different from the second inclination angle θ2. The difference between the first and second inclination angles θ1 and θ2 may occur because the dual vertical gate 110 is formed by performing two etching processes as will be described below with reference to FIGS. 7A to 7G. In some example embodiments, the first inclination angle θ1 may be about 90 degrees, and the second inclination angle θ2 may be less than the first inclination angle θ1. To obtain the difference between the first and second inclination angles θ1 and θ2, firstly, an upper side of the trench 113T, which has a rectangular shape with a sidewall that forms the first inclination angle $\theta 1$ with the imaginary line parallel to the first direction (x direction), may be formed by using a precise etching process. Next, a lower side of the trench 113T, which narrows downward to have a sidewall that forms the second inclination angle $\theta 2$ with the imaginary line parallel to the first direction (x direction), may be formed by using a typical etching process.

The connection portion 111 may connect two vertical portions 113 on the two vertical portions 113. The connection portion 111 may include a first region S1 and a second region S2, the first region S1 and the second region S2 being distinct regions. The first region S1 may overlap the vertical portions 113 in the second direction (z direction). The second region S2 may be the remaining region other than the first region S1. In some example embodiments, a top surface of the connection portion 111 may be at a higher level than the top surface of the device isolation layer 120. In some example embodiments, a bottom surface of the second region S2 of the connection portion 111 may be at a higher vertical level than a bottom surface of the first region S1 of the connection portion 111.

The dual vertical gate 110, according to various example embodiments, will be described in further detail below with reference to FIGS. 5A to 5E.

FIGS. 5A to 5E are cross-sectional views of a dual vertical gate according to some example embodiments. Specifically, FIGS. 5A to 5E are enlarged cross-sectional views of areas corresponding to region B of FIG. 4. Because components of FIGS. 5A to 5E are respectively similar to or the same as those of the image sensor 100 described with reference to FIG. 4, differences therebetween will mainly be described below.

Figure 5A:
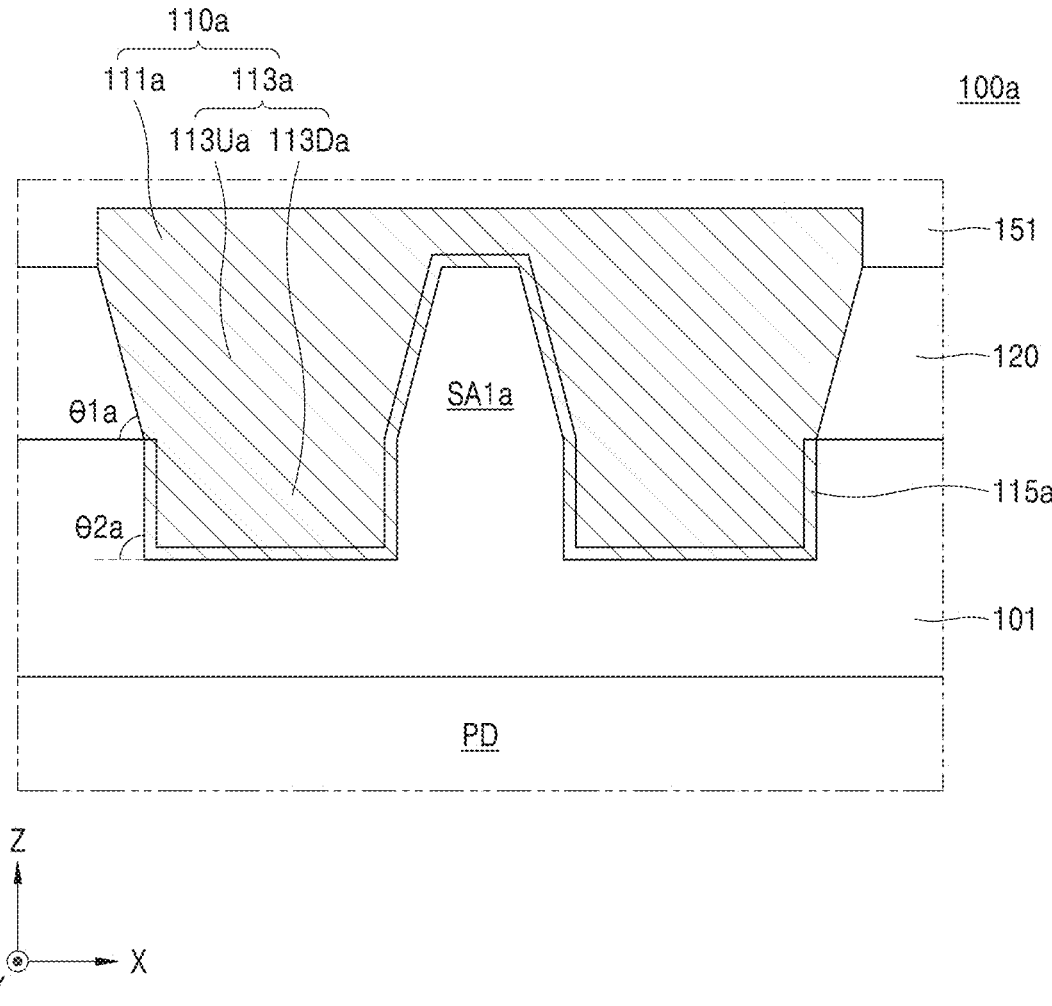
FIGS. 5A to 5E are cross-sectional views of a dual vertical gate according to some example embodiments.

Referring to FIG. 5A, a dual vertical gate 110$a$ may include a connection portion 111$a$ and a vertical portions 113$a$. The vertical portions 113$a$ may include an upper vertical portion 113Ua and a lower vertical portion 113Da. A sidewall of the upper vertical portion 113Ua may form a first inclination angle $\theta 1a$ with an imaginary line parallel to a first direction (x direction). A sidewall of the lower vertical portion 113Da may form a second inclination angle $\theta 2a$ with the imaginary line parallel to the first direction (x direction). In some example embodiments, the second inclination angle $\theta 2a$ may be about 90 degrees, and the first inclination angle $\theta 1a$ may be less than the second inclination angle $\theta 2a$. To obtain the difference between the first and second inclination angles $\theta 1a$ and $\theta 2a$, firstly, a trench, which narrows downward to have a sidewall that forms the first inclination angle $\theta 1a$ with the imaginary line parallel to the first direction (x direction), may be formed by using a typical etching process. Next, a trench, which has a rectangular shape with a sidewall that forms the second inclination angle $\theta 2a$ with the imaginary line parallel to the first direction (x direction), may be formed by using a precise etching process. Based on the first inclination angle $\theta 1a$ and the second inclination angle $\theta 2a$, a shape of an isolation area SA1$a$ may be different from the isolation area SA1 shown in FIG. 4.

Figure 5B:
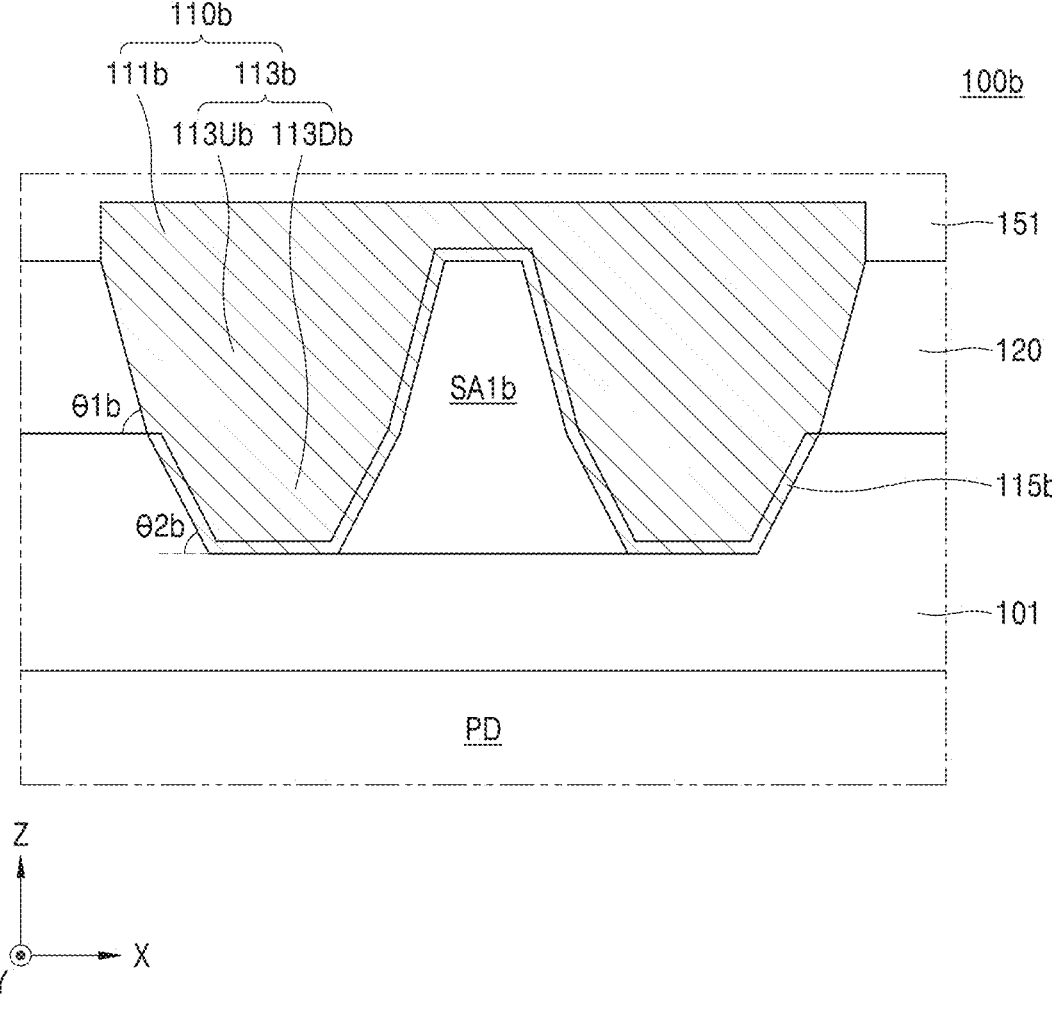

Referring to FIG. 5B, a dual vertical gate 110$b$ may include a connection portion 111$b$ and a vertical portions 113$b$. The vertical portions 113$b$ may include an upper vertical portion 113Ub and a lower vertical portion 113Db. A sidewall of the upper vertical portion 113Ub may form a first inclination angle $\theta 1b$ with an imaginary line parallel to a first direction (x direction). A sidewall of the lower vertical portion 113Db may form a second inclination angle $\theta 2b$ with the imaginary line parallel to the first direction (x direction). In some example embodiments, the first inclination angle $\theta 1b$ may be greater than the second inclination angle $\theta 2b$.

Based on the first inclination angle $\theta 1b$ and the second inclination angle $\theta 2b$, a shape of an isolation area SA1$b$ may be different from the isolation area SA1 shown in FIG. 4.

Figure 5C:
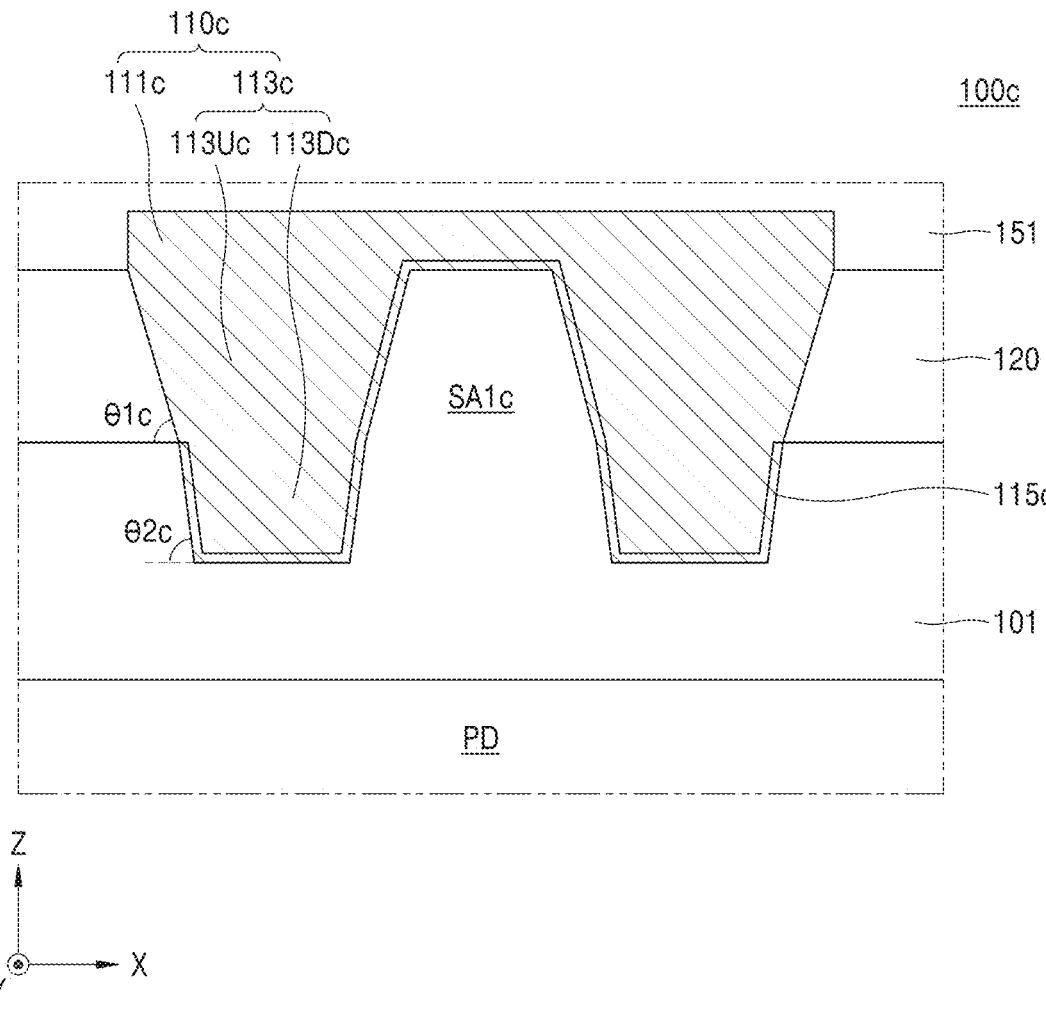

Referring to FIG. 5C, a dual vertical gate 110$c$ may include a connection portion 111$c$ and a vertical portions 113$c$. The vertical portions 113$c$ may include an upper vertical portion 113Uc and a lower vertical portion 113Dc. A sidewall of the upper vertical portion 113Uc may form a first inclination angle $\theta 1c$ with an imaginary line parallel to a first direction (x direction). A sidewall of the lower vertical portion 113Dc may form a second inclination angle $\theta 2c$ with the imaginary line parallel to the first direction (x direction). In some example embodiments, the first inclination angle $\theta 1c$ may be less than the second inclination angle $\theta 2c$. Based on the first inclination angle $\theta 1c$ and the second inclination angle $\theta 2c$, a shape of an isolation area SA1$c$ may be different from the isolation area SA1 shown in FIG. 4.

Figure 5D:
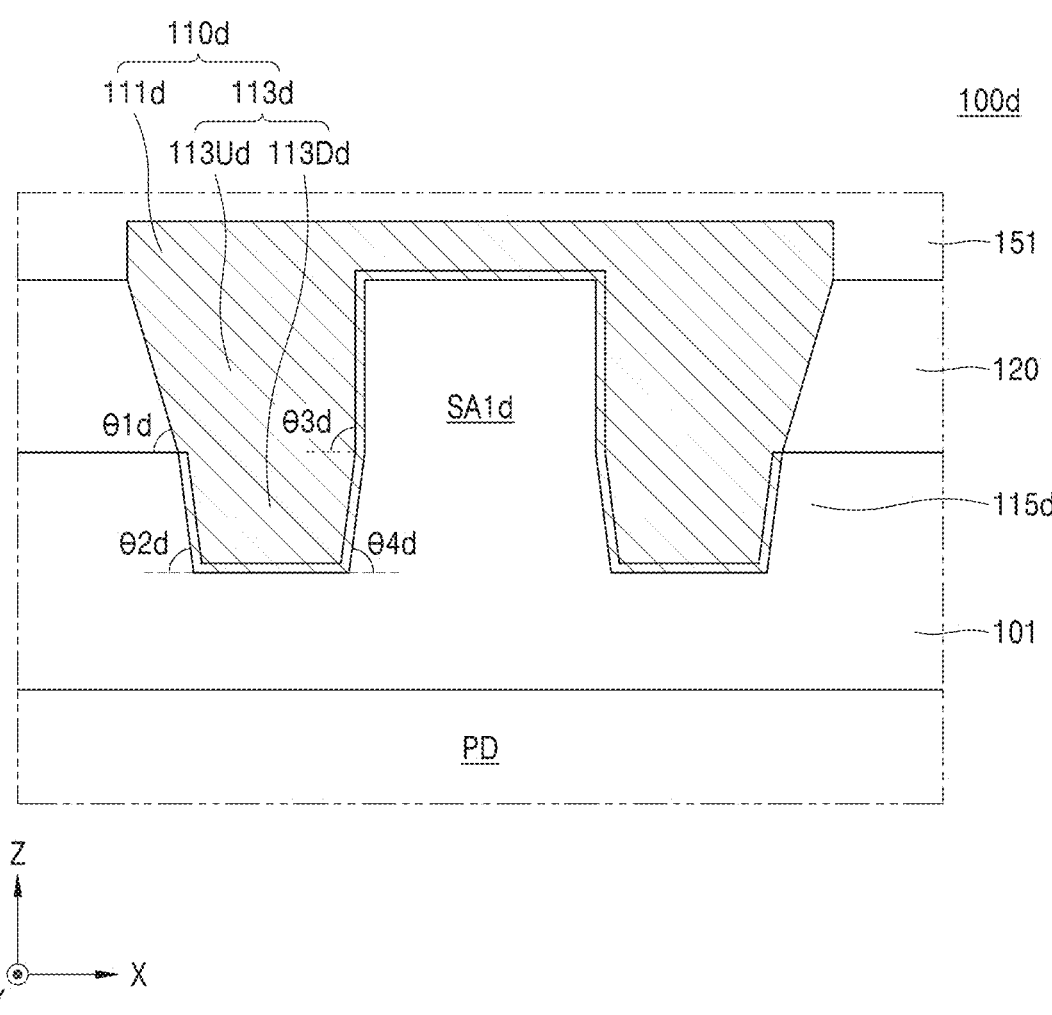

Referring to FIG. 5D, a dual vertical gate 110$d$ may include a connection portion 111$d$ and a vertical portions 113$d$. The vertical portions 113$d$ may include an upper vertical portion 113Ud and a lower vertical portion 113Dd. A sidewall of the upper vertical portion 113Ud, which is adjacent to a device isolation layer 120, may form a first inclination angle $\theta 1d$ with an imaginary line parallel to a first direction (x direction), and a sidewall of the upper vertical portion 113Ud, which is adjacent to an isolation area SA1$d$, may form a third inclination angle $\theta 3d$ with the imaginary line parallel to the first direction (x direction). A sidewall of the lower vertical portion 113Dd, which is adjacent to the device isolation layer 120, may form a second inclination angle $\theta 2d$ with the imaginary line parallel to the first direction (x direction), and a sidewall of the lower vertical portion 113Dd, which is adjacent to the isolation area SA1$d$, may form a fourth inclination angle $\theta 4d$ with the imaginary line parallel to the first direction (x direction). In some example embodiments, the first inclination angle $\theta 1d$ may be different from the third inclination angle $\theta 3d$, and the second inclination angle $\theta 2d$ may be equal to the fourth inclination angle $\theta 3d$. In other example embodiments, the first inclination angle $\theta 1d$ may be equal to the third inclination angle $\theta 3d$, and the second inclination angle $\theta 2d$ may be different from the fourth inclination angle $\theta 4d$. Based on the first inclination angle $\theta 1d$, the second inclination angle $\theta 2d$, the third inclination angle $\theta 3d$, and the fourth inclination angle $\theta 4d$, a shape of the isolation area SA1$d$ may be different from the isolation area SA1 shown in FIG. 4.

Figure 5E:
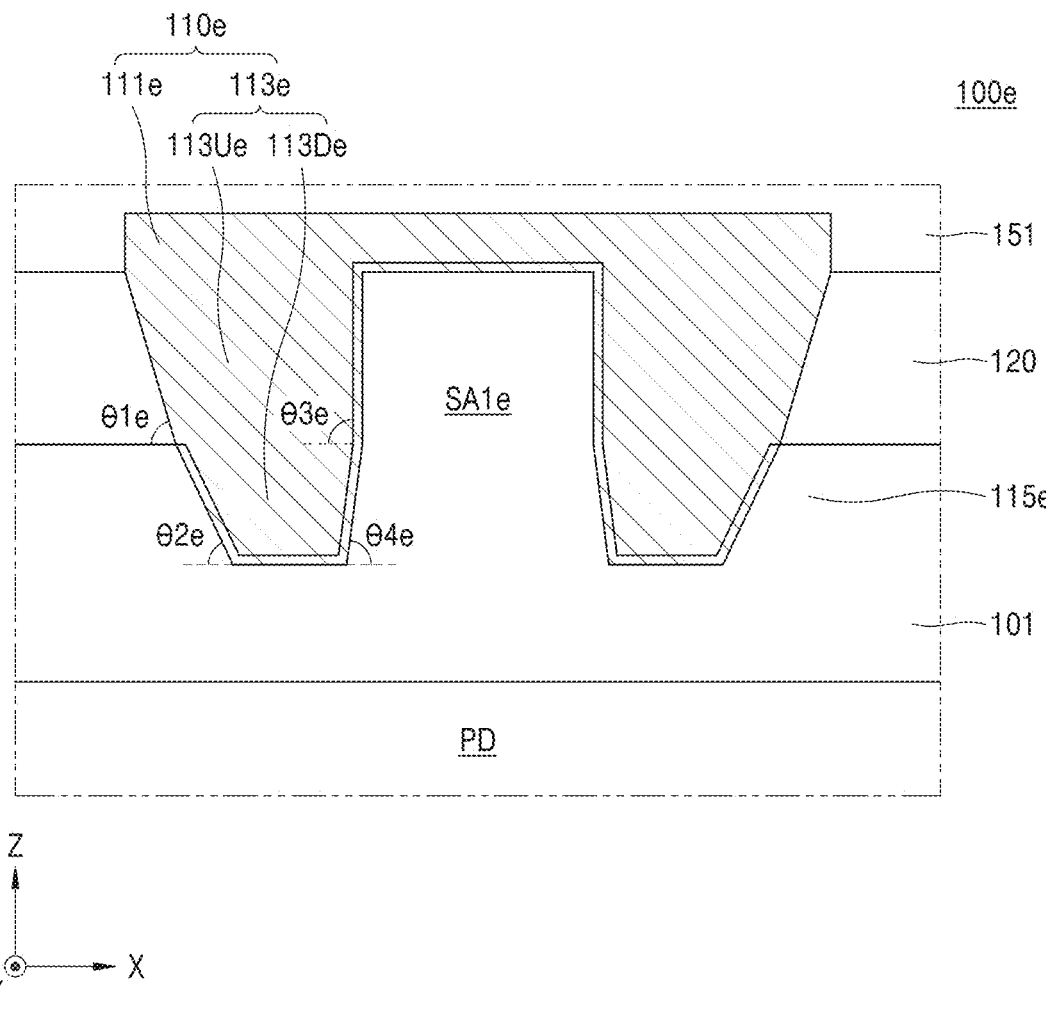

Referring to FIG. 5E, a dual vertical gate 110$e$ may include a connection portion 111$e$ and vertical portions 113$e$. The vertical portions 113$e$ may include an upper vertical portion 113Ue and a lower vertical portion 113De. A sidewall of the upper vertical portion 113Ue, which is adjacent to the device isolation layer 120, may form a first inclination angle $\theta 1e$ with the imaginary line parallel to the first direction (x direction), and a sidewall of the upper vertical portion 113Ue, which is adjacent to an isolation area SA1$e$, may form a third inclination angle $\theta 3e$ with the imaginary line parallel to the first direction (x direction). A sidewall of the lower vertical portion 113De, which is adjacent to the device isolation layer 120, may form a second inclination angle $\theta 2e$ with the imaginary line parallel to the first direction (x direction), and a sidewall of the lower vertical portion 113De, which is adjacent to the isolation area SA1$e$, may form a fourth inclination angle $\theta 4e$ with the imaginary line parallel to the first direction (x direction). In some example embodiments, the first inclination angle $\theta 1e$ may be different from the third inclination angle $\theta 3e$, and the second inclination angle $\theta 2e$ may be different from the fourth inclination angle θ4e. Based on the first inclination angle θ1e, the second inclination angle θ2e, the third inclination angle θ3e, and the fourth inclination angle θ4e, a shape of the isolation area SA1e may be different from the isolation area SA1 shown in FIG. 4.

In FIGS. 4 and 5A to 5E, the connection portions 111a to 111e and the vertical portions 113a to 113e may be formed using the same material as each other and integrally formed with each other.

The image sensors 100, 100a, 100b, 100c, 100d, and 100e according to the some example embodiments may respectively include the dual vertical gates 110, 110a, 110b, 110c, 110d, and 110e, each of (or alternatively, at least one of) which includes an upper vertical portion and a lower vertical portion, and sidewalls of each of (or alternatively, at least one of) the upper vertical portion and the lower vertical portion may have different inclination angles with a line extending in the first direction (X direction). As will be described below with reference to FIGS. 7A to 7G, because the dual vertical gate 110 is formed through a photoresist pattern PR2 having only one opening, a dual vertical gate having a smaller size may be formed as compared with the case in which a dual vertical gate is formed using a photoresist pattern having two openings. Accordingly, the miniaturization of a pixel area may be achieved. In addition, because trenches T1 and T2 are formed during the process of forming the device isolation layer 120 by using a dual shallow trench isolation (STI) process, the etching of the substrate 101 may be minimized as compared to the prior art, and thus, the interface characteristics and noise characteristics of the dual vertical gate 110 may be improved.

Referring back to FIGS. 3 and 4, the isolation area SA1 may be between two vertical portions 113. In some example embodiments, a top surface of the isolation area SA1 may be at the same vertical level as a top surface of the device isolation layer 120. On an X-Z plane, a shape of the isolation area SA1 may vary according to the first inclination angle θ1 and the second inclination angle θ2. The isolation area SA1 may extend in a third direction (Y direction), which is perpendicular to the first direction (X direction) and a second direction (Z direction). In this case, the isolation area SA1 may have a rectangular shape on the X-Y plane. Hereinafter, an isolation area according to various example embodiments will be described with reference to FIGS. 6A to 6C.

Figure 6A:
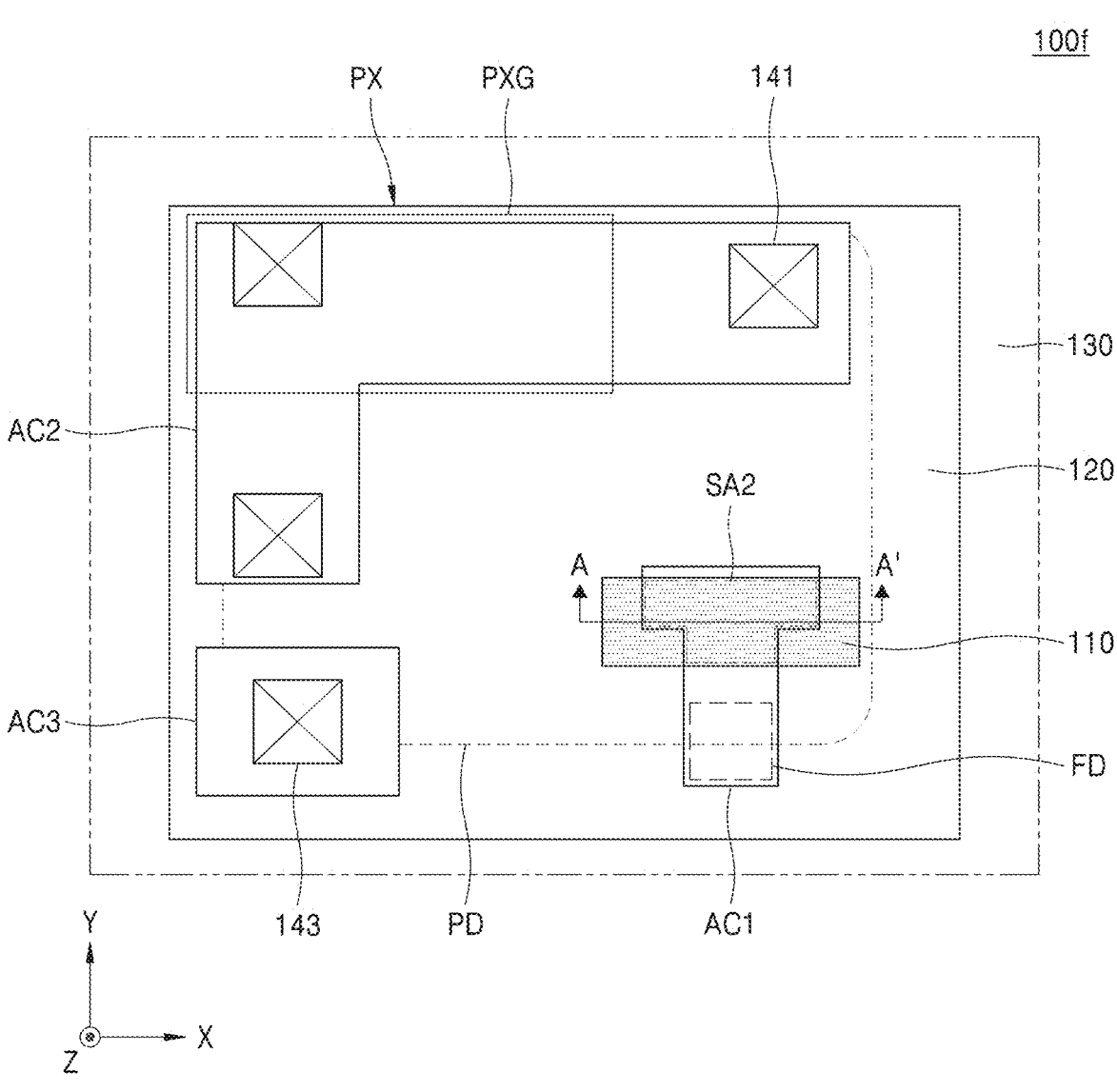
FIGS. 6A to 6C are plan views of pixels of image sensors, according to some example embodiments.
Figure 6B:
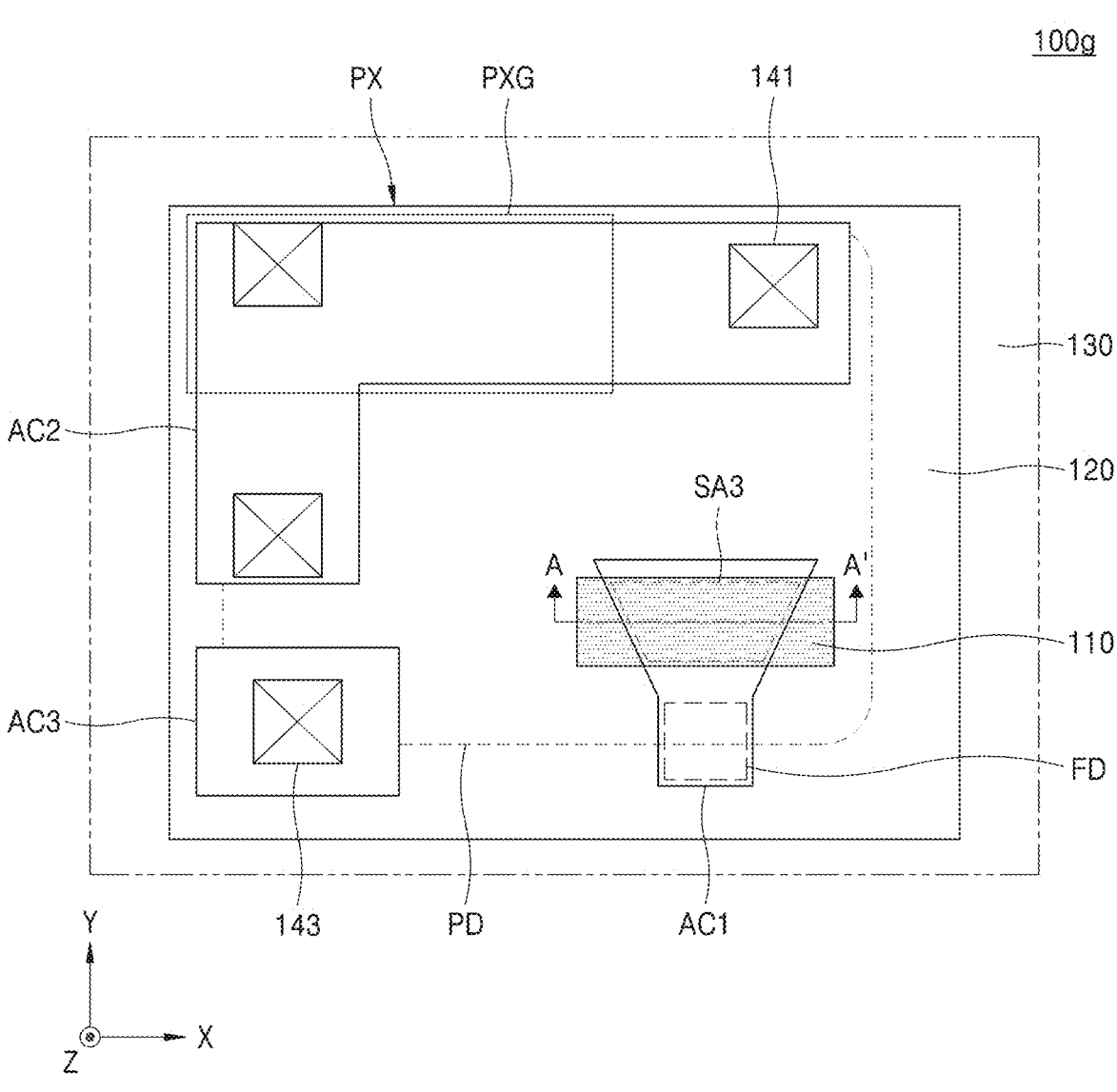
Figure 6C:
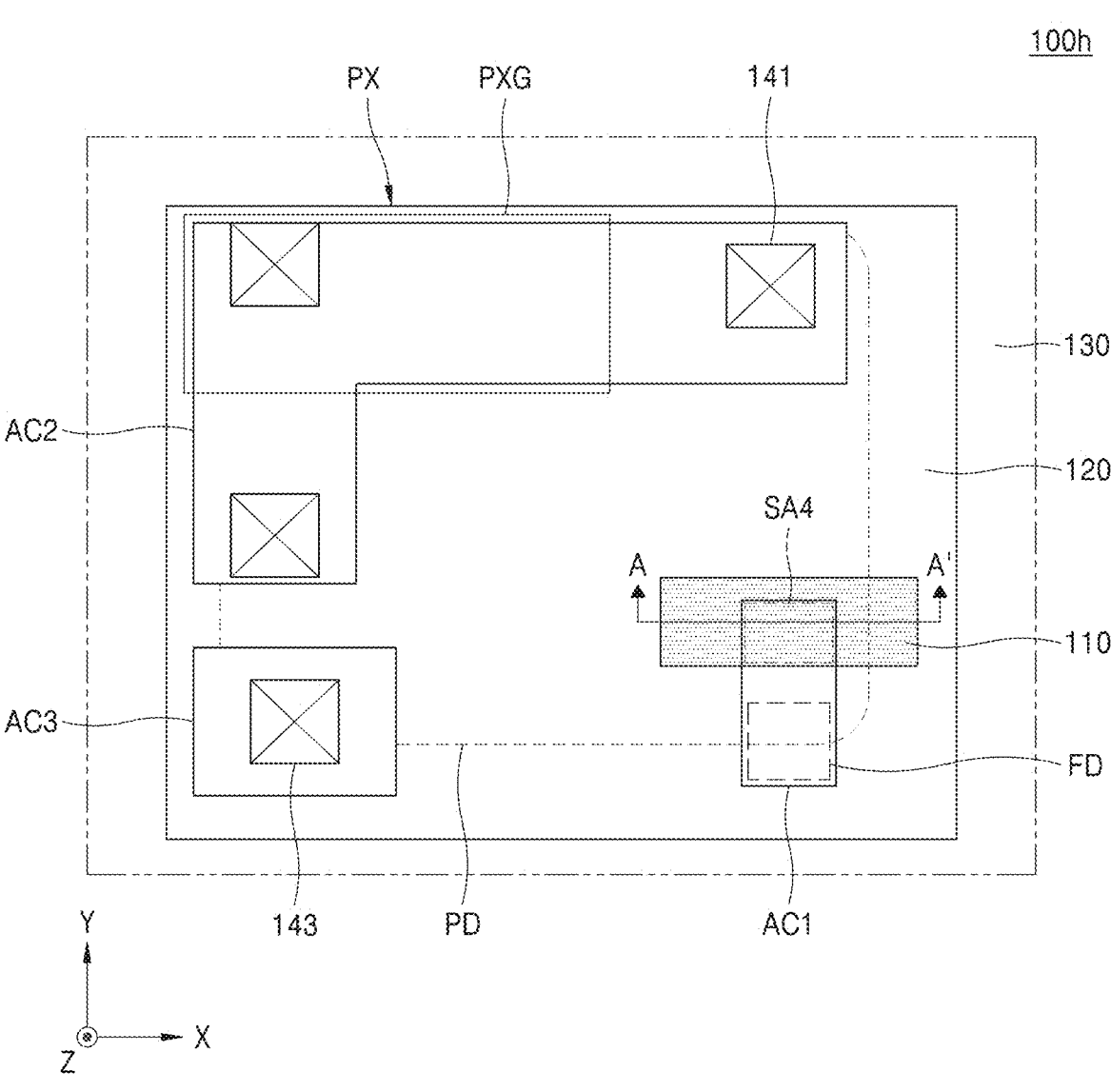

FIGS. 6A to 6C are plan views of pixels of image sensors, according to some example embodiments. Because components of FIGS. 6A to 6C are respectively similar to or the same as those of the image sensor 100 described with reference to FIG. 3, differences therebetween will mainly be described below.

In some example embodiments, referring to FIG. 6A, an isolation area SA2 may have a T shape on an X-Y plane. In this case, an area of a portion (i.e., a channel region) between a dual vertical gate 110 and a substrate 101 (e.g., a semiconductor substrate) in a first active area AC1 may be increased, and thus, transfer characteristics of an image sensor 100f may be improved.

In other some example embodiments, referring to FIG. 6B, an isolation area SA3 may have a trapezoidal shape on an X-Y plane. Similarly, an area of a portion (i.e., a channel region) between a dual vertical gate 110 and a substrate 101 in a first active area AC1 may be increased, and thus, transfer characteristics of the image sensor 100g may be improved.

In still other some example embodiments, referring to FIG. 6C, an isolation area SA4 may have a rectangular shape on an X-Y plane. In this case, differently from the isolation area SA1 shown in FIG. 3, a length of the isolation area SA4 of FIG. 6C in a third direction (Y direction) may be less than a length of the dual vertical gate 110 in the third direction (Y direction). In this case, differently from the image sensor 100 shown in FIG. 3, there may be three surfaces in contact between the dual vertical gate 110 and the substrate 101 in the first active area AC1 of an image sensor 100h of FIG. 6C. Accordingly, an area of a portion (i.e., a channel region) between a dual vertical gate 110 and a substrate 101 in a first active area AC1 may be increased, and thus, transfer characteristics of the image sensor 100h may be improved.

Referring back to FIG. 4, a gate dielectric layer 115 may be between the isolation area SA1 and the dual vertical gate 110. The gate dielectric layer 115 may include, for example, silicon oxide.

Logic transistors may be in the second active area AC2. For example, at least one of a reset transistor RX, a source follower transistor SFX, and a selection transistor SX may be in the second active area AC2. In another example, all the three transistors (i.e., RX, SFX, and SX) may be in the second active area AC2. In some example embodiments, the source follower transistor SFX and the selection transistor SX may be in the second active area AC2 of any one pixel area PX, and the reset transistor RX may be in the second active area AC2 of another pixel area PX adjacent thereto. In such structure, the logic transistors may be shared between the two pixel areas PX, which are adjacent to each other. A pixel gate PXG may be in the second active area AC2. The pixel gate PXG may be, for example, a reset gate (see RG in FIG. 2) or a selection gate (see SG in FIG. 2). Contact plugs 141 may be in the second active area AC2. The contact plugs 141 may be a power supply voltage contact plug.

The third active area AC3 may include an impurity region (not shown), and a contact plug 143 may be connected to the impurity region of the third active area AC3. The impurity region of the third active area AC3 may be a ground region, and the contact plug 143 connected to the impurity region may be a ground contact plug.

A plurality of transistors (e.g., TX, RX, SX, and SFX) and the device isolation layer 120, which are on a front surface 101A of the substrate 101, may be covered by a wiring structure 150. An electrical signal converted by the photoelectric conversion element PD may be signal-processed by the transistors (e.g., TX, RX, SX, and SFX) and the wiring structure 150, which are on the front surface 101A of the substrate 101. The wiring structure 150 may include a plurality of contact plugs 161 configured to be selectively connected to the transistors (e.g., TX, RX, SX, and SFX) including a transfer transistor TX, a plurality of conductive lines (e.g., 163 and 165) configured to be selectively connected to the transistors (e.g., TX, RX, SX, and SFX) through the contact plugs 161, and a plurality of interlayer insulating layers (e.g., 151, 153, and 155) covering the conductive lines 163 and 165.

Each of (or alternatively, at least one of) the plurality of contact plugs 161 and the conductive lines 163 and 165 may include a metal, a conductive metal nitride, or a combination thereof. For example, each of (or alternatively, at least one of) the plurality of contact plugs 161 and the conductive lines 163 and 165 may include copper (Cu), aluminum (Al), tungsten (W), titanium (Ti), molybdenum (Mo), tantalum (Ta), titanium nitride (TiN), tantalum nitride (TaN), zirconium nitride (ZrN), tungsten nitride (WN), or a combination thereof, without being limited thereto. Each of (or alternatively, at least one of) the interlayer insulating layers 151, 153, and 155 may include an oxide layer, a nitride layer, or a combination thereof.

The number and arrangement of the interlayer insulating layers 151, 153, and 155 and the number and arrangement of the conductive lines 163 and 165 are not limited to those illustrated in FIG. 4, and various changes and modifications may be made as necessary. The conductive lines 163 and 165 in the wiring structure 150 may include wirings connected to a plurality of transistors electrically connected to the photoelectric conversion element PD formed in the pixel area PX. The arrangement of the conductive lines 163 and 165 may be freely changed regardless of the arrangement of the photoelectric conversion element PD (e.g., a photodiode).

On the rear surface 101B of the substrate 101, an anti-reflection layer 170, a color filter CF, and a microlens ML may be stacked, for example sequentially stacked.

The anti-reflection layer 170 may prevent or hinder incident light passing through the color filter CF from being laterally reflected or scattered. The anti-reflection layer 170 may include a metal. For example, the anti-reflection layer 170 may include tungsten (W), aluminum (Al), copper (Cu), or a combination thereof. Differently from FIG. 4, the anti-reflection layer 170 may include a plurality of layers. For example, the anti-reflection layer 170 may include a first anti-reflection layer (not shown), a second anti-reflection layer (not shown), and a third anti-reflection layer (not shown). The first anti-reflection layer, the second anti-reflection layer, and the third anti-reflection layer may include the same metal as each other. For example, each of (or alternatively, at least one of) the first anti-reflection layer, the second anti-reflection layer, and the third anti-reflection layer may include tungsten (W). However, the inventive concepts are not limited thereto, and the first anti-reflection layer, the second anti-reflection layer, and the third anti-reflection layer may include different metals from each other.

The color filter CF may filter condensed light and provide the filtered light to the pixel area PX. In some example embodiments, the color filter CF may include a red color filter, a green color filter, a blue color filter, or a white color filter. The white color filter may be a transparent color filter that transmits light in a visible wavelength band. In other example embodiments, the color filter CF may have another color, such as cyan, magenta, or yellow.

The microlens ML may condense incident light. The microlens ML may be arranged or configurred to correspond to the photoelectric conversion element PD. The microlens ML may have an outwardly convex shape to condense light incident on the photoelectric conversion element PD. The microlens ML may be transparent. For example, the microlens ML may have a transmittance of about 90% or higher with respect to light in a visible light range. The microlens ML may include a material, for example, a styrene-based resin, an acrylic resin, a styrene-acryl copolymer resin, or a siloxane-based resin.

The substrate 101 of the image sensor 100 may further include an area in which a plurality of unit pixels PXU described with reference to FIG. 1 are arranged, and a peripheral circuit area (not shown) and a pad area (not shown) that are arranged around the plurality of unit pixels PXU. The peripheral circuit area may be an area including various types of circuits for controlling the plurality of unit pixels (see PXU in FIG. 1). For example, the peripheral circuit area may include a plurality of transistors. The plurality of transistors in the peripheral circuit area may be driven to provide a certain signal to the photoelectric conversion element PD formed in the pixel area PX, or control an output signal from the photoelectric conversion element PD. For example, the plurality of transistors in the peripheral circuit area may constitute various types of logic circuits, such as a timing generator, a row decoder, a row driver, a CDS, an ADC, a latch, and a column decoder. The pad area may include conductive pads electrically connected to the plurality of unit pixels PXU and the circuits in the peripheral circuit area. The conductive pads may function as connection terminals for supplying power and signals to the plurality of unit pixels PXU and the circuits in the peripheral circuit area from the outside.

FIGS. 7A to 7G are cross-sectional views of respective operations of a method of manufacturing a dual vertical gate, according to some example embodiments. Although a method of manufacturing the dual vertical gate 110 shown in FIG. 4 is described with reference to FIGS. 7A to 7G, it will be understood that the dual vertical gates 110a, 110b, 110c, 110d, and 110e described with reference to FIGS. 5A to 5E may be manufactured by making various modifications and changes within the scope of the inventive concepts.

Figure 7A:
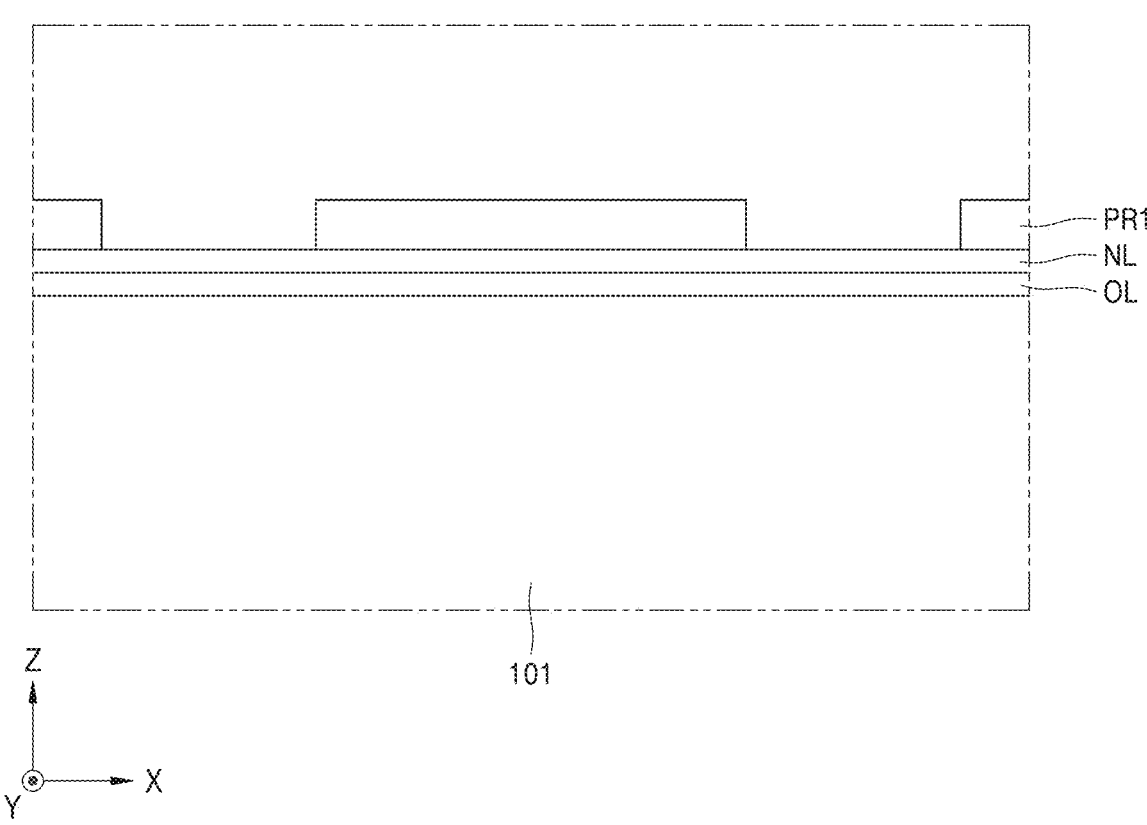
FIGS. 7A to 7G are cross-sectional views of respective operations of a method of manufacturing a dual vertical gate, according to some example embodiments.

Referring to FIG. 7A, to begin with, an oxide layer OL and a nitride layer NL may be sequentially formed on a substrate 101, and a first photoresist pattern PR1 may be formed on the nitride layer NL. The first photoresist pattern PR1 may have two openings.

Figure 7B:
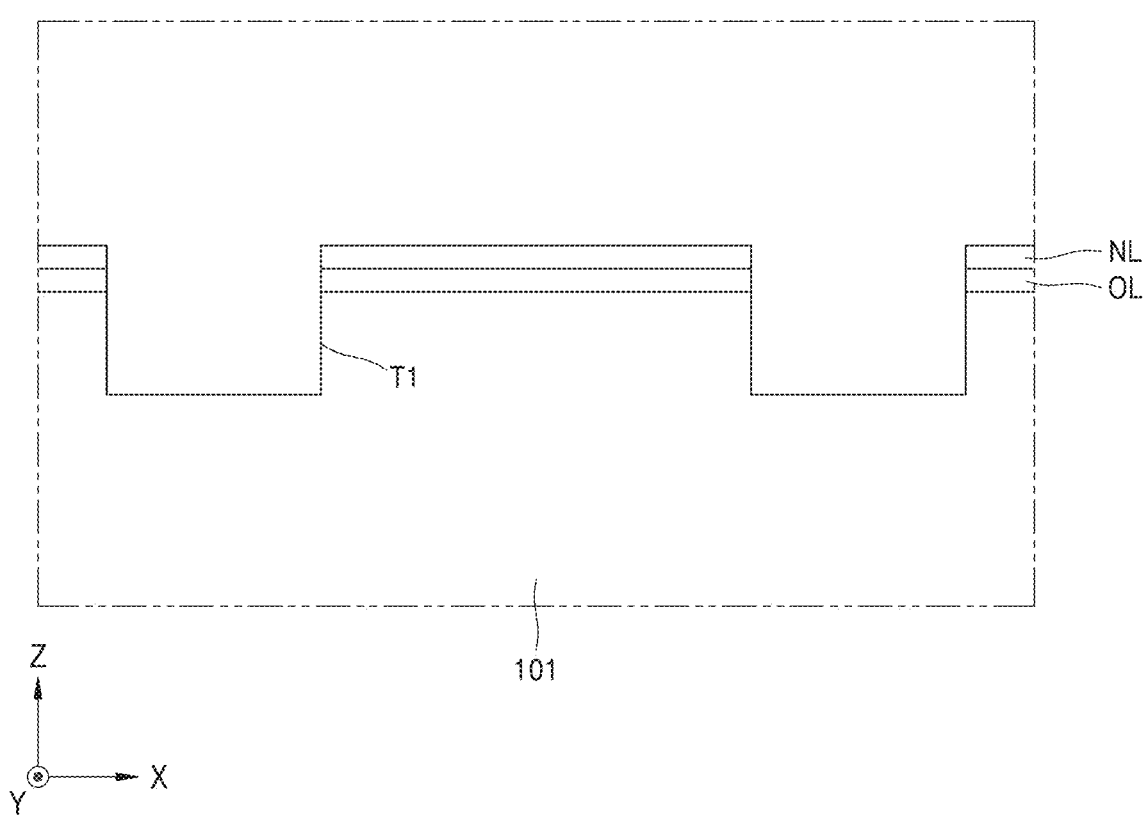

Next, referring to FIG. 7B, a first etching process may be performed by using the first photoresist pattern (see PR1 in FIG. 7A) having two openings, and thus, a first trench T1 may be formed in the substrate 101. A sidewall of the first trench T1 may form a first inclination angle (refer to θ1 in FIG. 4) with a line extending in a first direction (X direction). The first etching process may be, for example, a precise etching process. In this case, the first trench T1 may have a rectangular cross-section having the first inclination angle θ1 of about 90 degrees.

Figure 7C:
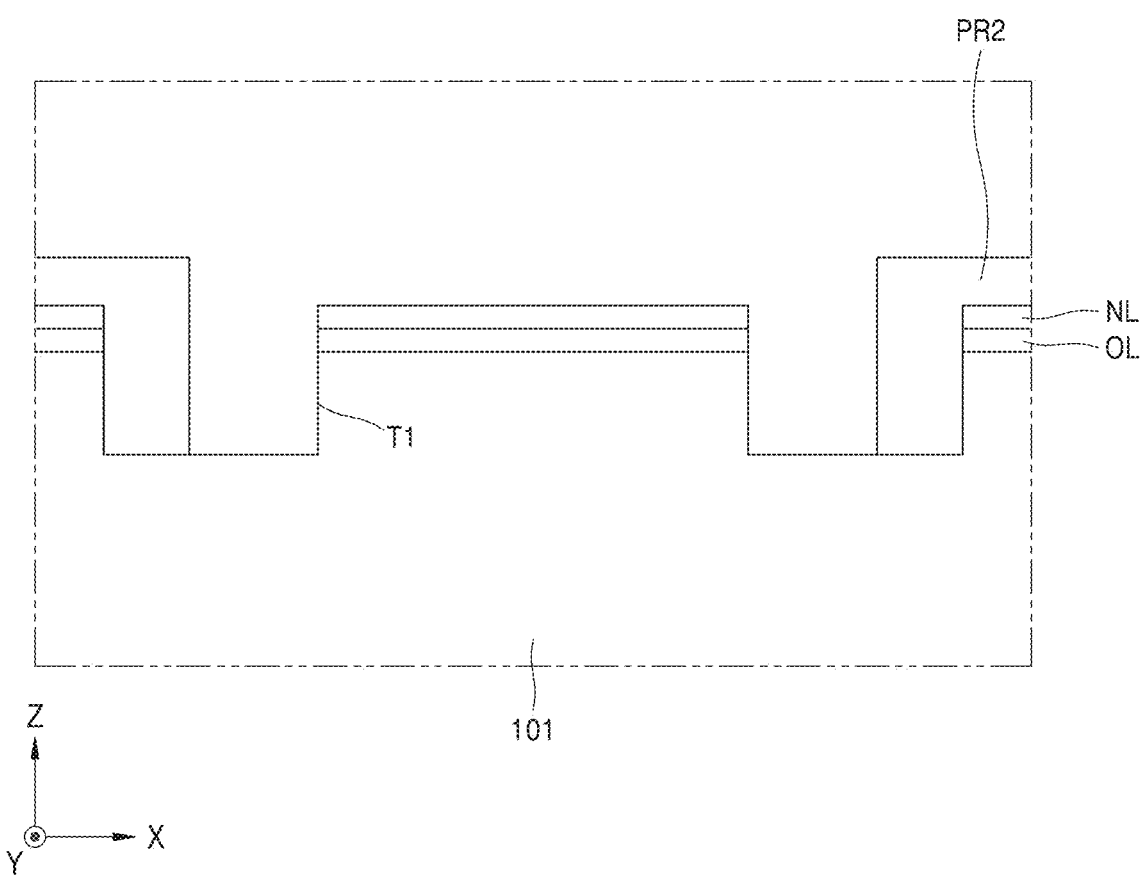

Referring to FIG. 7C, a second photoresist pattern PR2 may be formed on the substrate 101. The second photoresist pattern PR2 may have only one opening. The one opening may expose portions of the two first trenches T1 and the substrate 101 between the two first trenches T1. Even when the second photoresist pattern PR2 has only one opening, the oxide layer OL and the nitride layer NL may remain on the substrate 101 between the two first trenches T1, and thus, the substrate 101 between the two first trenches T1 may be protected in a second etching process to be described below with reference to FIG. 7D.

Figure 7D:
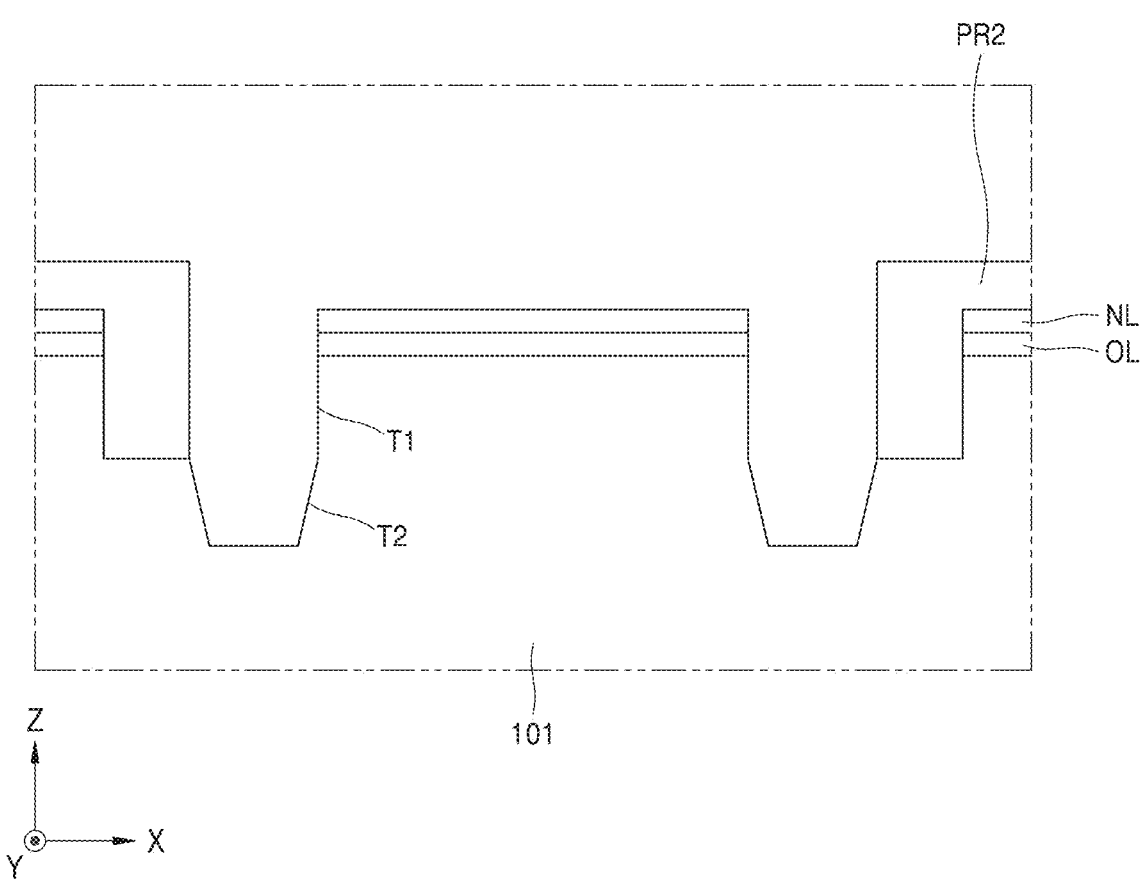

Referring to FIG. 7D, the second etching process may be performed by using the second photoresist pattern PR2 to form a second trench T2. The second trench T2 may pass through the substrate 101 to a greater depth than the first trench T1. A sidewall of the second trench T2 may form a second inclination angle (see θ2 in FIG. 4) with a line extending in the first direction (X direction). The second etching process may be, for example, a typical etching process. In this case, the second trench T2 may have a trapezoidal cross-section having the second inclination angle θ2 of less than 90 degrees.

Figure 7E:
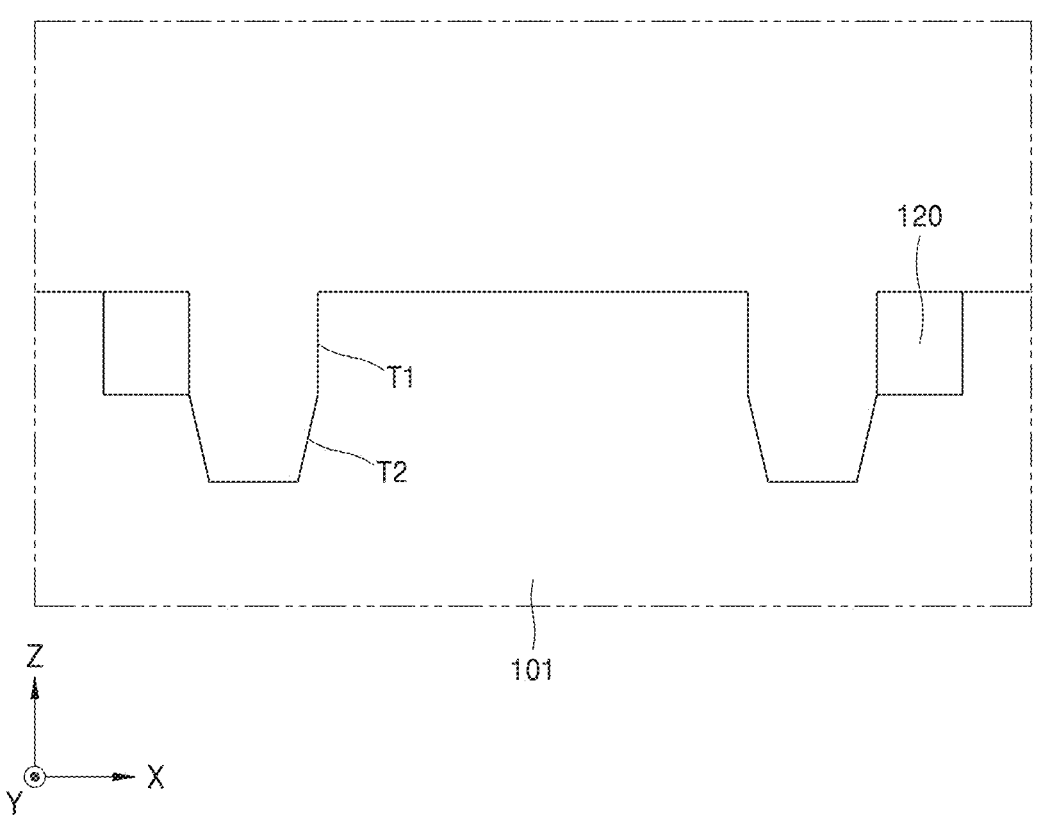

Referring to FIG. 7E, the first trench T1 and the second trench T2 may be filled with an insulating material, and a device isolation layer 120 may be formed by etching a portion of the insulating material. The insulating material may include, for example, silicon oxide.

Figure 7F:
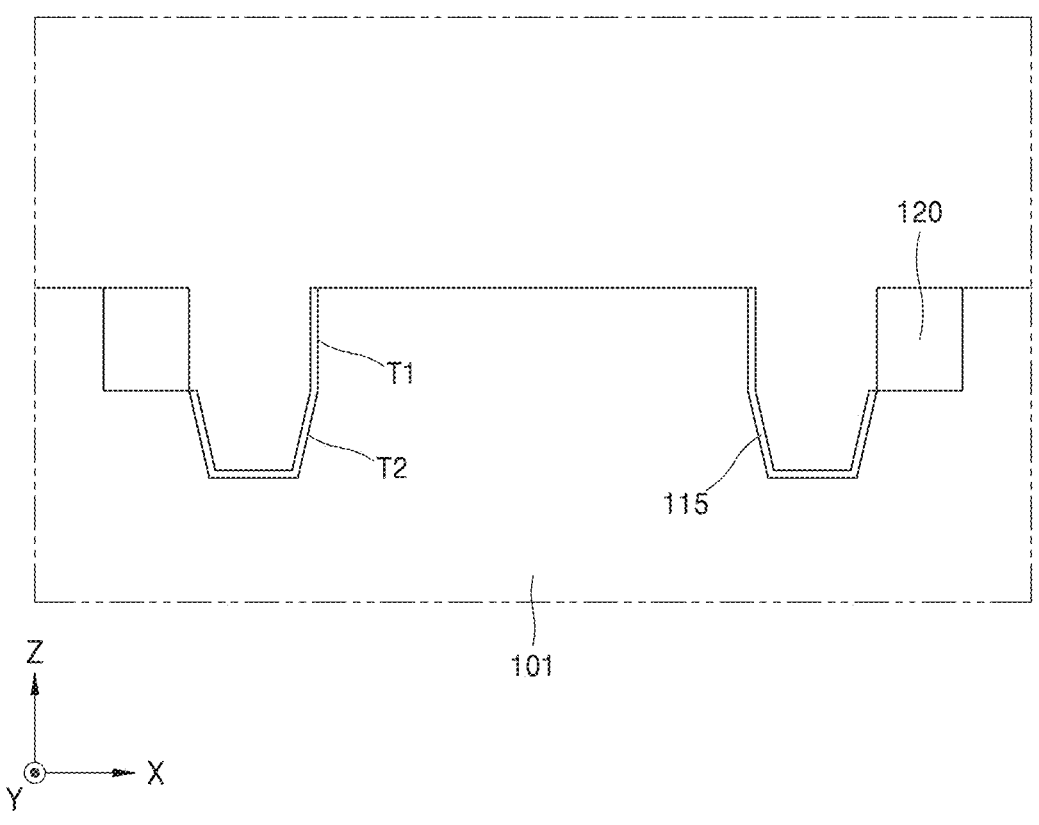

Referring to FIG. 7F, a gate dielectric layer 115 may be formed on inner walls of the first and second trenches T1 and T2 on the substrate 101. The gate dielectric layer 115 may include, for example, silicon oxide.

Figure 7G:
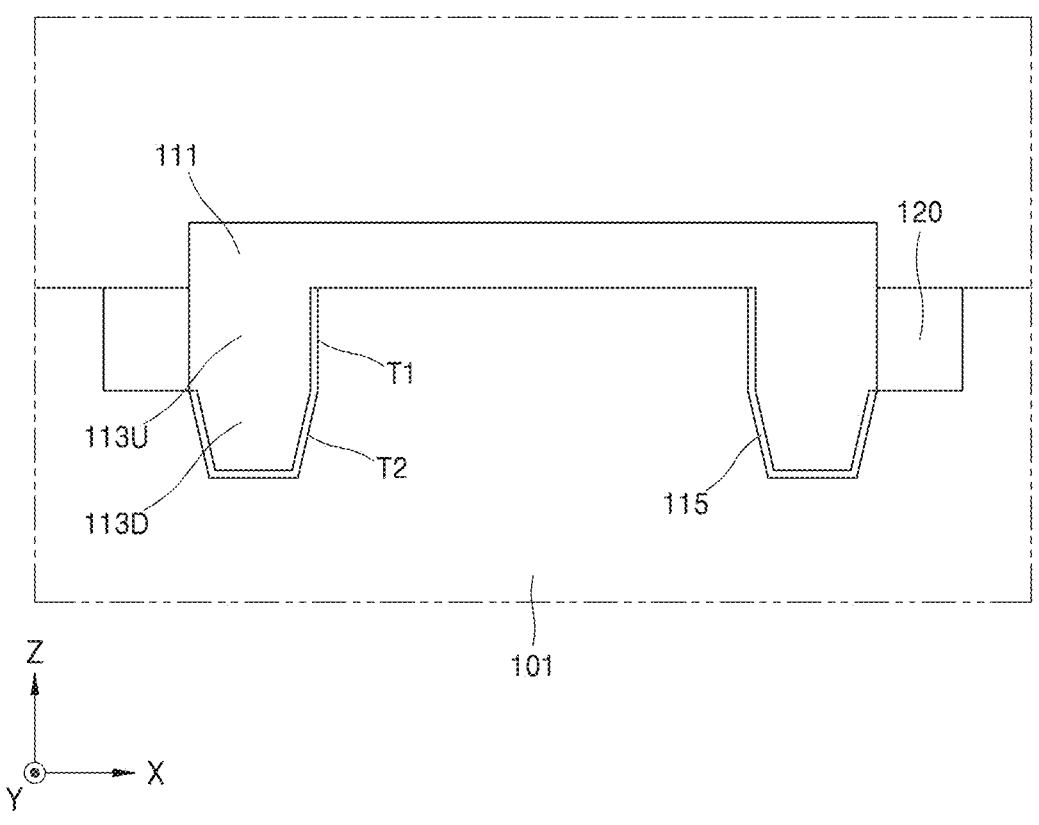

Referring to FIG. 7G, vertical portions 113U and 113D may be formed to fill the first and second trenches T1 and T2, respectively, and a connection portion 111 may be formed on the vertical portions 113U and 113D to connect the vertical portions 113U and 113D to each other. Thus, a dual vertical gate 110 may be formed.

When the dual vertical gate 110 is formed through the second photoresist pattern PR2 having only one opening, a dual vertical gate may be formed in a finer pixel area than when a dual vertical gate is formed using a photoresist pattern having two openings. Accordingly, the miniaturization of the pixel area may be achieved. In addition, because the first and second trenches T1 and T2 are formed during the process of forming the device isolation layer 120 by using a dual STI process, the etching of the substrate 101 may be minimized as compared to the prior art, and thus, the interface characteristics and noise characteristics of the dual vertical gate 110 may be improved. Furthermore, as described above with reference to FIGS. 7C and 7D, when the second etching process is performed, the oxide layer OL and the nitride layer OL on the substrate 101 may protect the substrate 101 between the first trenches T1. Thus, the second trench T2 may be formed in a portion of the first trench T1 in a self-aligned manner. Accordingly, a misalignment that may occur during an etching process may be improved.

Figure 8A:
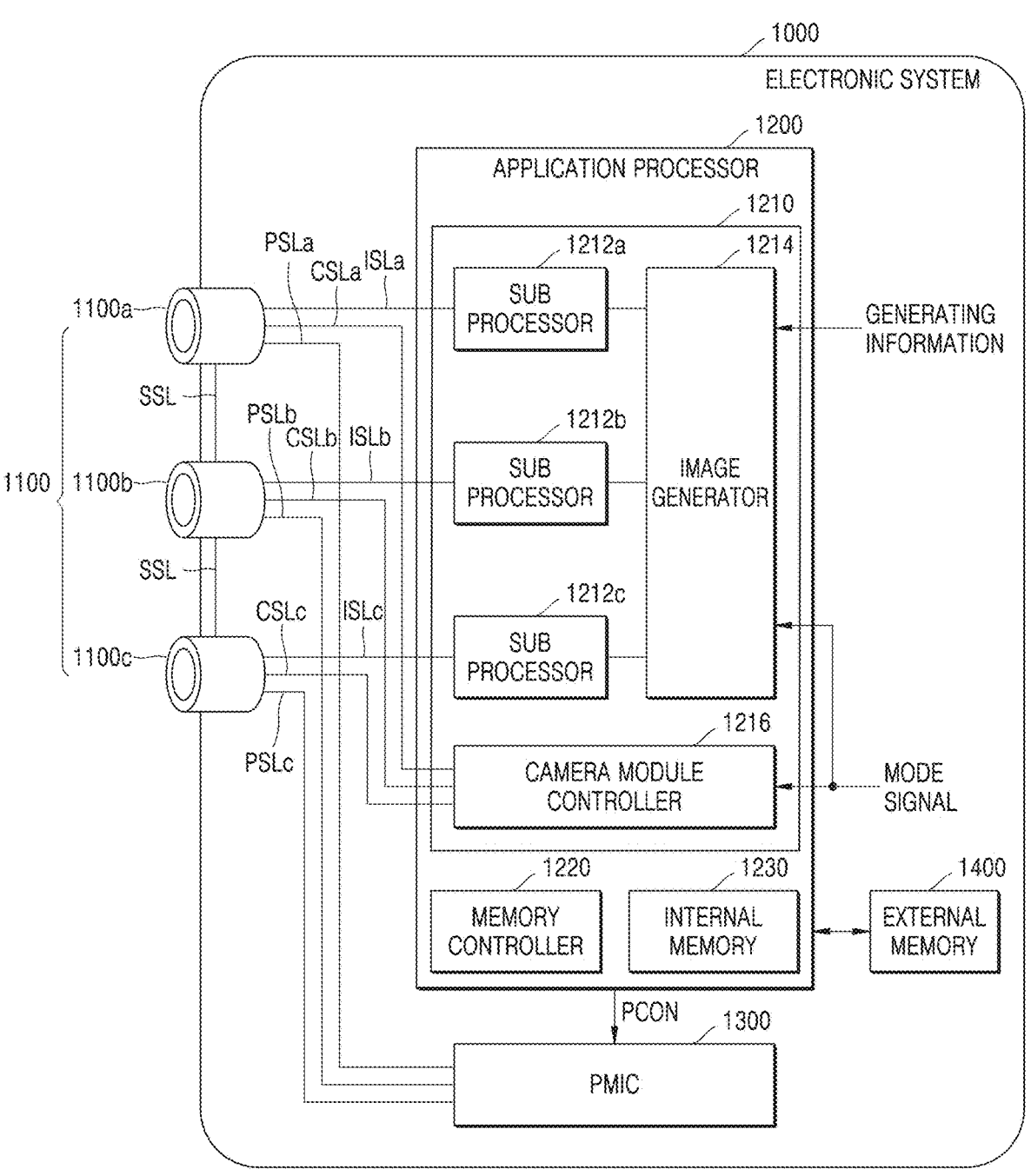
FIG. 8A is a block diagram of an electronic system according to some example embodiments.
Figure 8B:
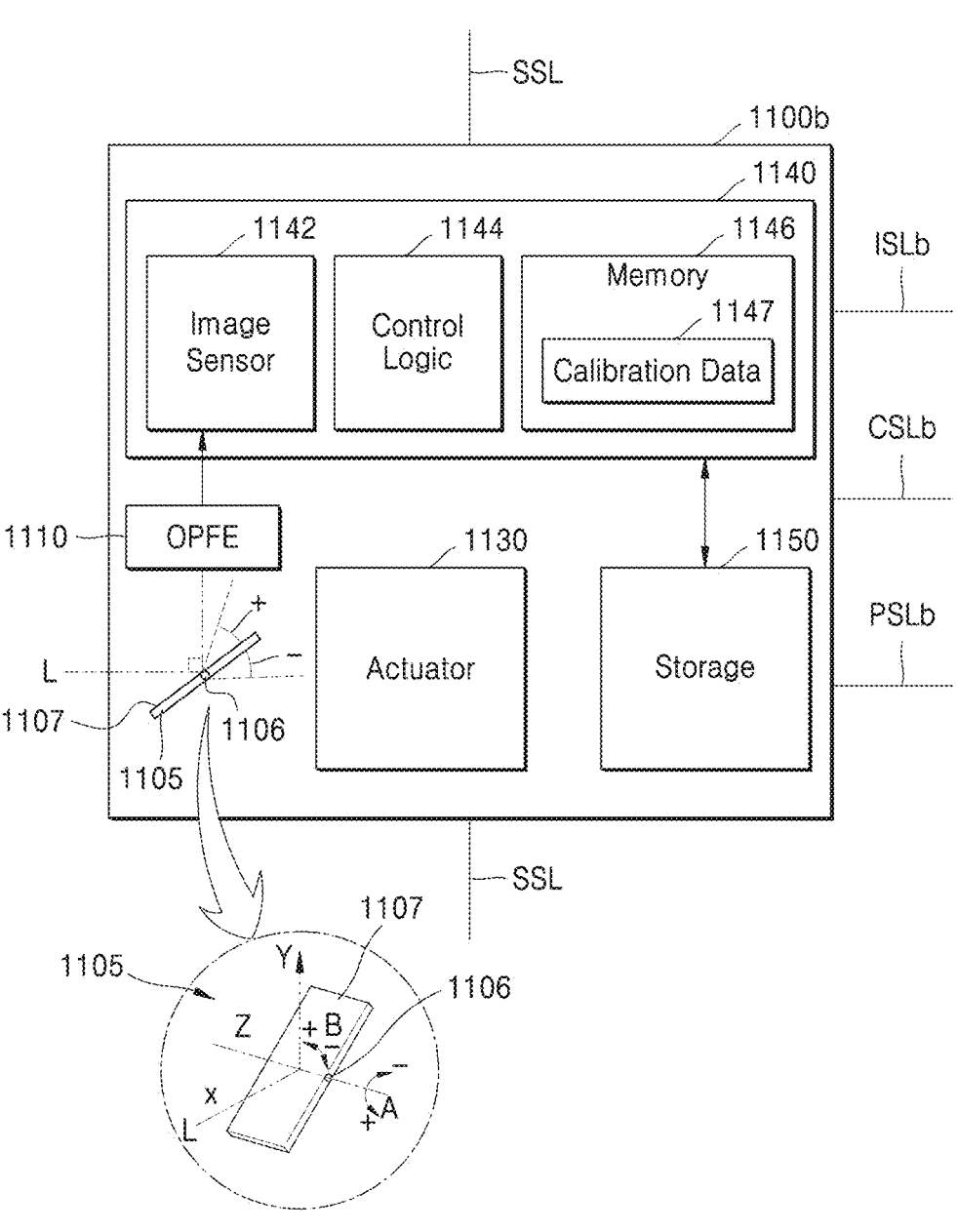
FIG. 8B is a detailed block diagram of a camera module included in the electronic system of FIG. 8A.

FIG. 8A is a block diagram of an electronic system 1000 according to some example embodiments, and FIG. 8B is a detailed block diagram of a camera module included in the electronic system of FIG. 8A.

Referring to FIG. 8A, the electronic system 1000 may include a camera module group 1100, an application processor 1200, a power management integrated circuit (PMIC) 1300, and an external memory 1400.

The camera module group 1100 may include a plurality of camera modules 1100a, 1100b, and 1100c. Although three camera modules 1100a, 1100b, and 1100c are illustrated in FIG. 8A, the inventive concepts are not limited thereto. In some example embodiments, the camera module group 1100 may be modified to include only two camera modules. In some example embodiments, the camera module group 1100 may be modified to include "n" camera modules, where "n" is a natural number of at least 4.

The detailed configuration of the camera module 1100b will be described with reference to FIG. 8B below. The descriptions below may be also applied to the other camera modules 1100a and 1100c.

Referring to FIG. 8B, the camera module 1100b may include a prism 1105, an optical path folding element (OPFE) 1110, an actuator 1130, an image sensing device 1140, and a storage 1150.

The prism 1105 may include a reflective surface 1107 of a light reflecting material and may change the path of light L incident from outside.

In some example embodiments, the prism 1105 may change the path of the light L incident in a first direction (an X direction in FIG. 8B) into a third direction (a Y direction in FIG. 8B) perpendicular to the first direction. The prism 1105 may rotate the reflective surface 1107 of the light reflecting material in a direction A around a central shaft 1106 or rotate the central shaft 1106 in a direction B to change the path of the light L incident in the first direction (the X direction) into the third direction (the Y direction) perpendicular to the first direction (the X direction). In this case, the OPFE 1110 may move in a second direction (a Z direction in FIG. 8B), which is perpendicular to the first direction (the X direction) and the third direction (the Y direction).

In some example embodiments, as illustrated in FIG. 8B, an A-direction maximum rotation angle of the prism 1105 may be less than or equal to about 15 degrees in a plus (+) A direction and greater than about 15 degrees in a minus (−) A direction. However, the inventive concepts are not limited thereto.

In some example embodiments, the prism 1105 may move by an angle of about 20 degrees or in a range from about 10 degrees to about 20 degrees or from about 15 degrees to about 20 degrees in a plus or minus B direction. In this case, an angle by which the prism 1105 moves in the plus B direction may be the same as or similar, within a difference of about 1 degree, to an angle by which the prism 1105 moves in the minus B direction.

In some example embodiments, the prism 1105 may move the reflective surface 1107 of the light reflecting material in the second direction (the Z direction) parallel with an extension direction of the central shaft 1106.

The OPFE 1110 may include, for example, "m" optical lenses, where "m" is a natural number. The "m" lenses may move in the third direction (the Y direction) and change an optical zoom ratio of the camera module 1100b. For example, when the default optical zoom ratio of the camera module 1100b is Z, the optical zoom ratio of the camera module 1100b may be changed to 3Z or 5Z or greater by moving the "m" optical lenses included in the OPFE 1110.

The actuator 1130 may move the OPFE 1110 or an optical lens to a certain position. For example, the actuator 1130 may adjust the position of the optical lens such that an image sensor 1142 is positioned at a focal length of the optical lens for accurate sensing.

The image sensing device 1140 may include the image sensor 1142, a control logic 1144, and a memory 1146. The image sensor 1142 may sense an image of an object using the light L provided through the optical lens. The control logic 1144 may control all operations of the camera module 1100b. For example, the control logic 1144 may control operation of the camera module 1100b according to a control signal provided through a control signal line CSLb.

The memory 1146 may store information, such as calibration data 1147, necessary for the operation of the camera module 1100b. The calibration data 1147 may include information, which is necessary for the camera module 1100b to generate image data using the light L provided from outside. For example, the calibration data 1147 may include information about a degree of rotation, information about a focal length, information about an optical axis, or the like. When the camera module 1100b is implemented as a multi-state camera that has a focal length varying with the position of the optical lens, the calibration data 1147 may include a value of a focal length for each position (or state) of the optical lens and information about auto focusing.

The storage 1150 may store image data sensed by the image sensor 1142. The storage 1150 may be provided outside the image sensing device 1140 and may form a stack with a sensor chip of the image sensing device 1140. In some example embodiments, although the storage 1150 may include electrically erasable programmable read-only memory (EEPROM), the inventive concepts are not limited thereto.

The image sensor 1142 may include the image sensor 100a, 100b, 100c, 100d, 100e, 100f, or 100g described with reference to FIGS. 1 to 6B, or an image sensor variously modified and changed therefrom within the scope of the inventive concepts.

Referring to FIGS. 8A and 8B, in some example embodiments, each of (or alternatively, at least one of) the camera modules 1100a, 1100b, and 1100c may include the actuator 1130. Accordingly, the camera modules 1100a, 1100b, and 1100c may include the calibration data 1147, which is the same or different among the camera modules 1100a, 1100b, and 1100c according to the operation of the actuator 1130 included in each of (or alternatively, at least one of) the camera modules 1100a, 1100b, and 1100c.

In some example embodiments, one (e.g., the camera module 1100b) of the camera modules 1100a, 1100b, and 1100c may be of a folded-lens type including the prism 1105 and the OPFE 1110, which are described above, while the other camera modules (e.g., the camera modules 1100a and 1100c) may be of a vertical type that does not include the prism 1105 and the OPFE 1110. However, the inventive concepts are not limited thereto.

In some example embodiments, one (e.g., the camera module 1100c) of the camera modules 1100a, 1100b, and 1100c may include a vertical depth camera, which extracts depth information using an infrared ray (IR). In this case, the application processor 1200 may generate a three-dimensional (3D) depth image by merging image data provided from the depth camera with image data provided from another camera module (e.g., the camera module 1100a or 1100b).

In some example embodiments, at least two camera modules (e.g., 1100a and 1100b) among the camera modules 1100a, 1100b, and 1100c may have different field-of-views. In this case, for example, the two camera modules (e.g., 1100a and 1100b) among the camera modules 1100a, 1100b, and 1100c may respectively have different optical lenses. However, the inventive concepts are not limited thereto.

In some example embodiments, the camera modules 1100a, 1100b, and 1100c may have different field-of-views from one another. In this case, although the camera modules 1100a, 1100b, and 1100c may respectively have different optical lenses, the inventive concepts are not limited thereto.

In some example embodiments, the camera modules 1100a, 1100b, and 1100c may be physically separated from one another. In other words, the sensing area of the image sensor 1142 is not divided and used by the camera modules 1100a, 1100b, and 1100c, but the image sensor 1142 may be independently included in each of (or alternatively, at least one of) the camera modules 1100a, 1100b, and 1100c.

Referring back to FIG. 8A, the application processor 1200 may include an image processing unit 1210, a memory controller 1220, and an internal memory 1230. The application processor 1200 may be separately implemented from the camera modules 1100a, 1100b, and 1100c. For example, the application processor 1200 and the camera modules 1100a, 1100b, and 1100c may be implemented in different semiconductor chips and separated from each other.

The image processing unit 1210 may include a plurality of sub-processors (e.g., 1212a, 1212b, and 1212c), an image generator 1214, and a camera module controller 1216. The image processing unit 1210 may include sub-processors (e.g., 1212a, 1212b, and 1212c) in number corresponding to the number of camera modules (e.g., 1100a, 1100b, 1100c).

Pieces of image data respectively generated by the camera modules 1100a, 1100b, and 1100c may be respectively provided to the corresponding ones of the sub-processors 1212a, 1212b, and 1212c through image signal lines ISLa, ISLb, and ISLc separated from each other. For example, image data generated by the camera module 1100a may be provided to the sub-processor 1212a through the image signal line ISLa, image data generated by the camera module 1100b may be provided to the sub-processor 1212b through the image signal line ISLb, and image data generated by the camera module 1100c may be provided to the sub-processor 1212c through the image signal line ISLc. Such image data transmission may be performed using, for example, a mobile industry processor interface (MIPI)-based camera serial interface (CSI). However, the inventive concepts are not limited thereto.

In some example embodiments, a single sub-processor may be arranged or configured to correspond to a plurality of camera modules. For example, differently from FIG. 8A, the sub-processors 1212a and 1212c may not be separated but may be integrated into a single sub-processor, and the image data provided from the camera module 1100a or the camera module 1100c may be selected by a selection element (e.g., a multiplexer) and then provided to the integrated sub-processor.

The image data provided to each of (or alternatively, at least one of) the sub-processors 1212a, 1212b, and 1212c may be provided to the image generator 1214. The image generator 1214 may generate an output image by using the image data provided from each of (or alternatively, at least one of) the sub-processors 1212a, 1212b, and 1212c according to image generation information or a mode signal.

In detail, the image generator 1214 may generate the output image by merging at least portions of respective pieces of image data, which are respectively generated by the camera modules 1100a, 1100b, and 1100c having different field-of-views, according to the image generation information or the mode signal. Alternatively, the image generator 1214 may generate the output image by selecting one of pieces of image data, which are respectively generated by the camera modules 1100a, 1100b, and 1100c having different field-of-views, according to the image generation information or the mode signal.

In some example embodiments, the image generation information may include a zoom signal or a zoom factor. In some example embodiments, the mode signal may be based on a mode selected by a user.

When the image generation information includes a zoom signal or a zoom factor and the camera modules 1100a, 1100b, and 1100c have different field-of-views, the image generator 1214 may perform different operations according to different kinds of zoom signals. For example, when the zoom signal is a first signal, the image generator 1214 may merge image data output from the camera module 1100a and image data output from the camera module 1100c and then generate an output image by using a merged image signal and image data output from the camera module 1100b and not used for merging. When the zoom signal is a second signal different from the first signal, the image generator 1214 may generate an output image by selecting one of the pieces of image data respectively output from the camera modules 1100a, 1100b, and 1100c, instead of performing the merging. However, the inventive concepts are not limited thereto, and a method of processing image data may be changed whenever necessary.

In some example embodiments, the image generator 1214 may receive a plurality of pieces of image data, which have different exposure times, from at least one of the sub-processors 1212a, 1212b, and 1212c and perform high dynamic range (HDR) processing on the pieces of image data, thereby generating merged image data having an increased dynamic range.

The camera module controller 1216 may provide a control signal to each of (or alternatively, at least one of) the camera modules 1100a, 1100b, and 1100c. A control signal generated by the camera module controller 1216 may be provided to a corresponding one of the camera modules 1100a, 1100b, and 1100*c* through a corresponding one of control signal lines CSLa, CSLb, and CSLc, which are separated from one another.

One (e.g., the camera module 1100*b*) of the camera modules 1100*a*, 1100*b*, and 1100*c* may be designated as a master camera according to the mode signal or the image generation signal including a zoom signal, and the other camera modules (e.g., the camera modules 1100*a* and 1100*c*) may be designated as slave cameras. Such designation information may be included in a control signal and provided to each of (or alternatively, at least one of) the camera modules 1100*a*, 1100*b*, and 1100*c* through a corresponding one of the control signal lines CSLa, CSLb, and CSLc, which are separated from one another.

A camera module operating as a master or a slave may be changed according to a zoom factor or an operation mode signal. For example, when the field-of-view of the camera module 1100*a* is greater than that of the camera module 1100*b* and the zoom factor indicates a low zoom ratio, the camera module 1100*b* may operate as a master and the camera module 1100*a* may operate as a slave. Contrarily, when the zoom factor indicates a high zoom ratio, the camera module 1100*a* may operate as a master and the camera module 1100*b* may operate as a slave.

In some example embodiments, a control signal provided from the camera module controller 1216 to each of (or alternatively, at least one of) the camera modules 1100*a*, 1100*b*, and 1100*c* may include a sync enable signal. For example, when the camera module 1100*b* is a master camera and the camera modules 1100*a* and 1100*c* are slave cameras, the camera module controller 1216 may transmit the sync enable signal to the camera module 1100*b*. The camera module 1100*b* provided with the sync enable signal may generate a sync signal based on the sync enable signal and may provide the sync signal to the camera modules 1100*a* and 1100*c* through a sync signal line SSL. The camera modules 1100*a*, 1100*b*, and 1100*c* may be synchronized with the sync signal and may transmit image data to the application processor 1200.

In some example embodiments, a control signal provided from the camera module controller 1216 to each of (or alternatively, at least one of) the camera modules 1100*a*, 1100*b*, and 1100*c* may include mode information according to the mode signal. The camera modules 1100*a*, 1100*b*, and 1100*c* may operate in a first operation mode or a second operation mode in relation with a sensing speed based on the mode information.

In the first operation mode, the camera modules 1100*a*, 1100*b*, and 1100*c* may generate an image signal at a first speed (e.g., at a first frame rate), encode the image signal at a second speed higher than the first speed (e.g., at a second frame rate higher than the first frame rate), and transmit an encoded image signal to the application processor 1200. In this case, the second speed may be 30 times or less the first speed.

The application processor 1200 may store the received image signal, i.e., the encoded image signal, in the internal memory 1230 therein or the external memory 1400 outside the application processor 1200. Thereafter, the application processor 1200 may read the encoded image signal from the internal memory 1230 or the external memory 1400, decode the encoded image signal, and display image data generated based on a decoded image signal. For example, a corresponding one of the sub-processors 1212*a*, 1212*b*, and 1212*c* of the image processing unit 1210 may perform the decoding and may also perform image processing on the decoded image signal.

In the second operation mode, the camera modules 1100*a*, 1100*b*, and 1100*c* may generate an image signal at a third speed lower than the first speed (e.g., at a third frame rate lower than the first frame rate) and transmit the image signal to the application processor 1200. The image signal provided to the application processor 1200 may not have been encoded. The application processor 1200 may perform image processing on the image signal or store the image signal in the internal memory 1230 or the external memory 1400.

The PMIC 1300 may provide power, e.g., a power supply voltage, to each of (or alternatively, at least one of) the camera modules 1100*a*, 1100*b*, and 1100*c*. For example, under control by the application processor 1200, the PMIC 1300 may provide first power to the camera module 1100*a* through a power signal line PSLa, second power to the camera module 1100*b* through a power signal line PSLb, and third power to the camera module 1100*c* through a power signal line PSLc.

The PMIC 1300 may generate power corresponding to each of (or alternatively, at least one of) the camera modules 1100*a*, 1100*b*, and 1100*c* and adjust the level of the power, in response to a power control signal PCON from the application processor 1200. The power control signal PCON may include a power adjustment signal for each operation mode of the camera modules 1100*a*, 1100*b*, and 1100*c*. For example, the operation mode may include a low-power mode. In this case, the power control signal PCON may include information about a camera module configured to operate in the low-power mode and a power level to be set. The same or different levels of power may be respectively provided to the camera modules 1100*a*, 1100*b*, and 1100*c*. The level of power may be dynamically changed.

Any of the elements and/or functional blocks disclosed above may include or be implemented in processing circuitry such as hardware including logic circuits; a hardware/software combination such as a processor executing software; or a combination thereof. For example, the timing controller 40, camera module controller 1216, memory controller 1220, sub processors 1212*a-c* and control logic 1144 may be implemented as processing circuitry. The processing circuitry specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

Processor(s), controller(s), and/or processing circuitry may be configured to perform actions or steps by being specifically programmed to perform those action or steps (such as with an FPGA or ASIC) or may be configured to perform actions or steps by executing instructions received from a memory, or a combination thereof.

While the inventive concepts have been particularly shown and described with reference to some example embodiments thereof, it will be understood that various changes in form and details may be made therein without departing from the spirit and scope of the following claims.

What is claimed is:
1. An image sensor comprising:
    a dual vertical gate comprising two vertical portions and
        a connection portion on the two vertical portions, the two vertical portions being spaced apart from each other in a first direction by an isolation area, the two vertical portions extending into a substrate in a second direction, the connection portion connecting the two vertical portions to each other, wherein the second direction is perpendicular to the first direction, wherein the connection portion includes distinct first and second regions, the first region of the connection portion overlapping the two vertical portions of the dual vertical gate, and a bottom surface of the second region of the connection portion being at a higher vertical level than a bottom surface of the first region of the connection portion; and a device isolation layer on side surfaces of the vertical portions, the side surfaces being spaced apart from each other in the first direction, wherein each of the two vertical portions comprises an upper vertical portion and a lower vertical portion, a sidewall of the upper vertical portion forms a first inclination angle with a line extending in the first direction, a sidewall of the lower vertical portion forms a second inclination angle with the line extending in the first direction, and the first inclination angle is different from the second inclination angle.

2. The image sensor of claim 1, wherein the isolation area includes silicon and the isolation area extends in a third direction, and the third direction is perpendicular to the first direction and the second direction.

3. The image sensor of claim 1, wherein a cross-section of the isolation area perpendicular to the second direction has a rectangular shape.

4. The image sensor of claim 1, wherein a cross-section of the isolation area perpendicular to the second direction has a rectangular shape, and a length of the cross-section of the isolation area in a third direction is less than a length of the dual vertical gate in the third direction.

5. The image sensor of claim 1, wherein a cross-section of the isolation area perpendicular to the second direction has a trapezoidal shape.

6. The image sensor of claim 1, wherein a cross-section of the isolation area perpendicular to the second direction has a T shape.

7. The image sensor of claim 1, wherein a top surface of the connection portion is at a higher vertical level than a top surface of the device isolation layer.

8. An image sensor comprising:

a substrate;

a dual vertical gate in an upper portion of the substrate;

a photoelectric conversion element under the dual vertical gate in the substrate;

a device isolation layer adjacent to the dual vertical gate in a first direction, the first direction being parallel to a top surface of the substrate; and a floating diffusion region adjacent to the dual vertical gate in the upper portion of the substrate, wherein the dual vertical gate comprises two vertical portions apart from each other by an isolation area in the first direction, the two vertical portions extending into the substrate in a second direction, wherein the second direction is perpendicular to the first direction, and a connection portion connecting the two vertical portions to each other on the two vertical portions, the connection portion including distinct first and second regions, the first region of the connection portion overlapping the two vertical portions of the dual vertical gate, and a bottom surface of the second region of the connection portion being at a higher vertical level than a bottom surface of the first region of the connection portion, wherein each of the two vertical portions comprises an upper vertical portion and a lower vertical portion, a sidewall of the upper vertical portion forms a first inclination angle with a line extending in the first direction, a sidewall of the lower vertical portion forms a second inclination angle with the line extending in the first direction, and the first inclination angle is different from the second inclination angle.

9. The image sensor of claim 8, wherein a top surface of the isolation area is at a same vertical level as a top surface of the device isolation layer.

10. The image sensor of claim 8, wherein the isolation area includes silicon and the isolation area extends in a third direction, and the third direction is perpendicular to the first direction and the second direction.

11. The image sensor of claim 8, wherein a cross-section of the isolation area perpendicular to the second direction has any one of a rectangular shape, a trapezoidal shape, and a T shape.

12. The image sensor of claim 11, wherein a cross-section of the isolation area perpendicular to the second direction has a smaller length in a third direction than a length of the dual vertical gate in the third direction.

13. The image sensor of claim 8, wherein a sidewall of the upper vertical portion adjacent to the device isolation layer forms the first inclination angle with the line extending in the first direction, a sidewall of the upper vertical portion adjacent to the isolation area forms a third inclination angle with the line extending in the first direction, and the first inclination angle is different from the third inclination angle.

14. The image sensor of claim 8, wherein a sidewall of the lower vertical portion adjacent to the device isolation layer forms the second inclination angle with the line extending in the first direction, a sidewall of the lower vertical portion adjacent to the isolation area forms a fourth inclination angle with the line extending in the first direction, and the second inclination angle is different from the fourth inclination angle.

15. The image sensor of claim 8, wherein a bottom surface of the device isolation layer is at a same vertical level as a top surface of the lower vertical portion.

16. An image sensor comprising:

a substrate;

a dual vertical gate in an upper portion of the substrate;

a gate dielectric layer surrounding at least a portion of the dual vertical gate;

a photoelectric conversion element under the gate vertical gate in the substrate;

a device isolation layer adjacent to the dual vertical gate in a first direction in the upper portion of the substrate, the first direction being parallel to a top surface of the substrate; and a floating diffusion region adjacent to the dual vertical gate in the upper portion of the substrate, wherein the dual vertical gate comprises two vertical portions apart from each other by an isolation area in the first direction, the two vertical portions vertically extending into the substrate in a second direction, wherein the second direction is perpendicular to the first direction, and a connection portion connecting the two vertical portions to each other on the two vertical portions, wherein the connection portion includes distinct first and second regions, the first region of the connection portion overlapping the two vertical portions of the dual vertical gate, and a bottom surface of the second region of the connection portion being at a higher vertical level than a bottom surface of the first region of the connection portion, wherein each of the two vertical portions comprises an upper vertical portion and a lower vertical portion, a sidewall of the upper vertical portion forms a first inclination angle with a line extending in the first direction, a sidewall of the lower vertical portion forms a second inclination angle with the line extending in the first direction, wherein the second inclination angle is different from the first inclination angle, and wherein a top surface of the upper vertical portion is at a same vertical level as a top surface of the device isolation layer, a bottom surface of the upper vertical portion is at a same vertical level as a bottom surface of the device isolation layer, and the upper vertical portion is in contact with the device isolation layer.

17. The image sensor of claim 16, wherein a sidewall of the upper vertical portion adjacent to the device isolation layer forms the first inclination angle with the line extending in the first direction, a sidewall of the upper vertical portion adjacent to the isolation area forms a third inclination angle with the line extending in the first direction, a sidewall of the lower vertical portion adjacent to the device isolation layer forms the second inclination angle with the line extending in the first direction, and a sidewall of the lower vertical portion adjacent to the isolation area forms a fourth inclination angle with the line extending in the first direction, and the third inclination angle is different from the first inclination angle, and the fourth inclination angle is different from the second inclination angle.

18. The image sensor of claim 16, wherein the isolation area includes silicon of the substrate and extends in a third direction, and a cross-section of the isolation area perpendicular to the second direction has any one of a rectangular shape, a trapezoidal shape, and a T shape, and the third direction is perpendicular to the first direction and the second direction.

19. The image sensor of claim 16, wherein a cross-section of the isolation area perpendicular to the second direction has a smaller length than the dual vertical gate in a third direction.

* * * * *